United States Patent
Harada et al.

(10) Patent No.: US 9,012,897 B2
(45) Date of Patent: *Apr. 21, 2015

(54) ORGANIC EL ELEMENT, DISPLAY DEVICE, AND LIGHT-EMITTING DEVICE

(71) Applicant: Panasonic Corporation, Osaka (JP)

(72) Inventors: Kenji Harada, Osaka (JP); Seiji Nishiyama, Osaka (JP); Takahiro Komatsu, Osaka (JP); Takayuki Takeuchi, Hyogo (JP); Satoru Ohuchi, Osaka (JP); Hirofumi Fujita, Osaka (JP); Shinya Fujimura, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/746,474

(22) Filed: Jan. 22, 2013

(65) Prior Publication Data

US 2013/0140543 A1 Jun. 6, 2013

Related U.S. Application Data

(63) Continuation of application No. PCT/JP2010/004960, filed on Aug. 6, 2010.

(51) Int. Cl.
*H01L 51/50* (2006.01)
*H01L 27/32* (2006.01)
(Continued)

(52) U.S. Cl.
CPC ........ *H01L 51/5088* (2013.01); *H01L 27/3246* (2013.01); *H01L 51/5218* (2013.01); *H01L 51/5271* (2013.01); *H01L 51/56* (2013.01); *H01L 2251/5361* (2013.01)

(58) Field of Classification Search
CPC ............ H01L 51/0036; H01L 51/0545; H01L 51/5088

USPC ............................................. 257/40; 438/22
See application file for complete search history.

(56) References Cited

U.S. PATENT DOCUMENTS 5,294,869 A   3/1994   Tang et al.
5,443,922 A   8/1995   Nishizaki et al.
(Continued)

FOREIGN PATENT DOCUMENTS

EP   2175504       4/2010
JP   05-163488 A   6/1993
(Continued)

OTHER PUBLICATIONS

Meyer et al., Charge generation layers comprising transition metal-oxide/organic interfaces: Electronic structure and charge generation mechanism, May 2010, Applied Physics Letters, 96, 193302, pp. 1-3.*

(Continued)

*Primary Examiner* — Matthew W Such
*Assistant Examiner* — Warren H Kilpatrick
(74) *Attorney, Agent, or Firm* — Greenblum & Bernstein, P.L.C.

(57) ABSTRACT

An organic EL element comprises: an anode; a cathode; a functional layer that is disposed between the anode and the cathode and includes at least a light-emitting layer; a hole injection layer disposed between the anode and the functional layer; and a bank. The hole injection layer contains tungsten oxide, and has a recessed portion. A UPS spectrum of the hole injection layer, obtained from a UPS measurement, has a protrusion appearing near a Fermi surface and within a region corresponding to a binding energy range lower than a top of a valence band. The tungsten oxide contained in the hole injection layer satisfies a condition, determined from an XPS measurement, that a ratio in a number density of atoms other than tungsten atoms and oxygen atoms to the tungsten atoms does not exceed approximately 0.83.

20 Claims, 24 Drawing Sheets

(51) Int. Cl.
*H01L 51/52* (2006.01)
*H01L 51/56* (2006.01)

(56) References Cited

U.S. PATENT DOCUMENTS

| | | | |
|---|---|---|---|
| 5,688,551 | A | 11/1997 | Littman et al. |
| 6,132,280 | A | 10/2000 | Tanabe et al. |
| 6,284,393 | B1 | 9/2001 | Hosokawa et al. |
| 6,309,801 | B1 | 10/2001 | Meijer et al. |
| 7,785,718 | B2 | 8/2010 | Yatsunami et al. |
| 2002/0051894 | A1 | 5/2002 | Yoshikawa |
| 2002/0158835 | A1 | 10/2002 | Kobayashi et al. |
| 2003/0137242 | A1 | 7/2003 | Seki |
| 2004/0075385 | A1 | 4/2004 | Tao |
| 2004/0178414 | A1 | 9/2004 | Frey et al. |
| 2005/0064633 | A1 | 3/2005 | Mikoshiba |
| 2005/0073243 | A1 | 4/2005 | Yamazaki et al. |
| 2005/0170208 | A1 | 8/2005 | Yatsunami et al. |
| 2005/0208206 | A1 | 9/2005 | Yoshikawa |
| 2005/0266763 | A1* | 12/2005 | Kimura et al. .......... 445/24 |
| 2006/0008931 | A1 | 1/2006 | Lee et al. |
| 2006/0181583 | A1 | 8/2006 | Usuda |
| 2006/0204788 | A1 | 9/2006 | Yoshikawa |
| 2006/0243377 | A1 | 11/2006 | Matsuo et al. |
| 2006/0284166 | A1 | 12/2006 | Chua et al. |
| 2007/0029929 | A1 | 2/2007 | Nakamura et al. |
| 2007/0034864 | A1 | 2/2007 | Liu |
| 2007/0092981 | A1 | 4/2007 | Jung et al. |
| 2007/0148333 | A1 | 6/2007 | Morimoto |
| 2007/0172978 | A1 | 7/2007 | Chua et al. |
| 2007/0241665 | A1 | 10/2007 | Sakanoue et al. |
| 2007/0290604 | A1 | 12/2007 | Sakanoue et al. |
| 2008/0063949 | A1 | 3/2008 | Inoue |
| 2008/0150422 | A1 | 6/2008 | Ohara |
| 2008/0231179 | A1 | 9/2008 | Abe et al. |
| 2008/0312437 | A1 | 12/2008 | Inoue et al. |
| 2009/0058268 | A1 | 3/2009 | Yoshida et al. |
| 2009/0115318 | A1 | 5/2009 | Gregory et al. |
| 2009/0160325 | A1 | 6/2009 | Yatsunami et al. |
| 2009/0200917 | A1 | 8/2009 | Yamagata et al. |
| 2009/0224664 | A1 | 9/2009 | Yoshida et al. |
| 2009/0243478 | A1 | 10/2009 | Shoda et al. |
| 2009/0272999 | A1 | 11/2009 | Yoshida et al. |
| 2009/0284135 | A1 | 11/2009 | Yoshida et al. |
| 2009/0284141 | A1 | 11/2009 | Sakanoue et al. |
| 2009/0284144 | A1 | 11/2009 | Fujioka et al. |
| 2009/0284146 | A1 | 11/2009 | Yoshida et al. |
| 2010/0084672 | A1 | 4/2010 | Ueno et al. |
| 2010/0102310 | A1 | 4/2010 | Komatsu et al. |
| 2010/0181554 | A1* | 7/2010 | Yoshida et al. ......... 257/40 |
| 2010/0213827 | A1 | 8/2010 | Yoshida et al. |
| 2010/0258833 | A1 | 10/2010 | Okumoto et al. |
| 2010/0302221 | A1 | 12/2010 | Okumoto |
| 2011/0037065 | A1 | 2/2011 | Ueno et al. |
| 2011/0037068 | A1 | 2/2011 | Yamazaki et al. |
| 2011/0042703 | A1 | 2/2011 | Okumoto et al. |
| 2011/0140091 | A1 | 6/2011 | Friend et al. |
| 2011/0140596 | A1 | 6/2011 | Yoshida et al. |
| 2011/0180821 | A1 | 7/2011 | Matsushima |
| 2011/0198623 | A1 | 8/2011 | Matsushima |
| 2011/0198624 | A1 | 8/2011 | Matsushima |
| 2011/0204410 | A1 | 8/2011 | Yada |
| 2012/0061656 | A1 | 3/2012 | Ohuchi et al. |
| 2012/0132935 | A1 | 5/2012 | Isobe et al. |
| 2012/0178191 | A1 | 7/2012 | Sakanoue et al. |

FOREIGN PATENT DOCUMENTS

| | | |
|---|---|---|
| JP | 10-162959 A | 6/1998 |
| JP | 2000-133446 A | 5/2000 |
| JP | 2000-223276 A | 8/2000 |
| JP | 2002-075661 A | 3/2002 |
| JP | 2002-530881 A | 9/2002 |
| JP | 2002-318556 A | 10/2002 |
| JP | 3369615 B2 | 11/2002 |
| JP | 2003-007460 A | 1/2003 |
| JP | 2003-249375 A | 9/2003 |
| JP | 2003-264083 A | 9/2003 |
| JP | 2004-139746 A | 5/2004 |
| JP | 2004-228355 A | 8/2004 |
| JP | 2004-234901 A | 8/2004 |
| JP | 2004-527093 A | 9/2004 |
| JP | 2004-363170 A | 12/2004 |
| JP | 2005-012173 A | 1/2005 |
| JP | 2005-197189 A | 7/2005 |
| JP | 2005-203339 A | 7/2005 |
| JP | 2005-203340 A | 7/2005 |
| JP | 2005-267926 A | 9/2005 |
| JP | 2005-268099 A | 9/2005 |
| JP | 2005-331665 A | 12/2005 |
| JP | 2006-024573 A | 1/2006 |
| JP | 2006-114928 A | 4/2006 |
| JP | 3789991 B2 | 4/2006 |
| JP | 2006-185869 A | 7/2006 |
| JP | 2006-253443 A | 9/2006 |
| JP | 2006-294261 A | 10/2006 |
| JP | 2006-344459 A | 12/2006 |
| JP | 2007-073499 A | 3/2007 |
| JP | 2007-095606 A | 4/2007 |
| JP | 2007-214066 A | 8/2007 |
| JP | 2007-527542 A | 9/2007 |
| JP | 2007-287353 A | 11/2007 |
| JP | 2007-288071 A | 11/2007 |
| JP | 2007-288074 A | 11/2007 |
| JP | 2008-041747 A | 2/2008 |
| JP | 2008-053556 A | 3/2008 |
| JP | 2008-091072 A | 4/2008 |
| JP | 2008-124268 A | 5/2008 |
| JP | 2008-140724 A | 6/2008 |
| JP | 2008-177557 A | 7/2008 |
| JP | 2008-241238 A | 10/2008 |
| JP | 2008-270731 A | 11/2008 |
| JP | 2009-004347 A | 1/2009 |
| JP | 2009-044103 A | 2/2009 |
| JP | 2009-048960 A | 3/2009 |
| JP | 2009-054582 A | 3/2009 |
| JP | 2009-058897 A | 3/2009 |
| JP | 2009-218156 A | 9/2009 |
| JP | 2009-239180 A | 10/2009 |
| JP | 2009-260306 A | 11/2009 |
| JP | 2009-277590 A | 11/2009 |
| JP | 2009-277788 A | 11/2009 |
| JP | 2010-010670 A | 1/2010 |
| JP | 2010-021138 A | 1/2010 |
| JP | 2010-021162 A | 1/2010 |
| JP | 2010-033972 A | 2/2010 |
| JP | 2010-050107 A | 3/2010 |
| JP | 2010-073700 A | 4/2010 |
| JP | 2010-103374 A | 5/2010 |
| JP | 2010-161070 A | 7/2010 |
| JP | 2010-161185 A | 7/2010 |
| JP | 2011-040167 A | 2/2011 |
| WO | 2004/036663 | 4/2004 |
| WO | 2008/120714 A1 | 10/2008 |
| WO | 2008/149498 A1 | 12/2008 |
| WO | 2008/149499 A1 | 12/2008 |
| WO | WO 2009/107323 A1 * | 3/2009 ............ 257/40 |
| WO | 2009/107323 | 9/2009 |
| WO | 2010/032443 A1 | 3/2010 |
| WO | 2010/032444 A1 | 3/2010 |
| WO | 2010/058716 A1 | 5/2010 |
| WO | 2010/070798 A1 | 6/2010 |
| WO | 2010/092795 A1 | 8/2010 |
| WO | 2010/092796 A1 | 8/2010 |
| WO | 2010/092797 A1 | 8/2010 |
| WO | 2011/021343 A1 | 2/2011 |
| WO | 2012/017495 A1 | 2/2012 |
| WO | 2012/017502 A1 | 2/2012 |
| WO | 2012/017503 A1 | 2/2012 |

OTHER PUBLICATIONS

Elam et al., Nucleation and growth during tungsten atomic layer depostion on SiO2 surfaces, 2001, Thin Solid Films, 386, pp. 41-52.*

(56) References Cited

OTHER PUBLICATIONS

Extended European Search Report (EESR) in European Patent Application No. 10741075.5, dated Feb. 11, 2013.
United States Office Action in U.S. Appl. No. 13/205,748, dated Jun. 17, 2014.
China Office Action from State Intellectual Property Office (SIPO) in Chinese Patent Application No. 201080007024.X, dated Sep. 4, 2013, together with a partial English language translation.
China Office Action from State Intellectual Property Office (SIPO) in Chinese Patent Application No. 201080007024.X, dated May 15, 2014, together with a partial English language translation.
European Office Action in European Patent Application No. 10741075.5, dated Dec. 2, 2013.
United States Office Action in U.S. Appl. No. 13/742,575, dated Jul. 17, 2014.
United States Office Action in U.S. Appl. No. 13/742,575, dated Mar. 14, 2014.
United States Office Action in U.S. Appl. No. 13/742,584, dated Apr. 14, 2014.
Ramana et al., "Electron microscopy investigation of structural transformation in tungsten oxide (WO3) thin films", Physica Status Solidi (a) 202, No. 10, pp. R108-R110 (Jul. 6, 2005).
Horsley et al., "Structure of Surface Tungsten Oxide Species in the WO3/AL2O3 Supported Oxide System from X-Ray Absorption Near-edge Spectroscopy and Raman Spectroscopy", Journal of Physical Chemistry, 91, pp. 4014-4020 (1987).
United States Office Action in U.S. Appl. No. 13/742,593, dated Apr. 3, 2014.
United States Office Action in U.S. Appl. No. 13/205,748, dated Oct. 25, 2013.
Tungsten Trioxide, Wikipedia, The Free Encyclopedia, available at http://en.wikipedia.org/wiki/Tungsten(VI_oxide, accessed Jan. 10, 2014.
Tungsten Oxide, McGraw-Hill Dictionary of Scientific and Technical Terms, McGraw-Hill Book Company, Fourth Edition, p. 1979, date stamped Feb. 28, 1989.
Tungsten Oxide, Iwanami Rikagaku Jiten, Iwanami Shoten, Publishers, Fifth Edition, p. 533, left column, line 42 to right column, line 19, dated Feb. 20, 1998, together with an English language translation thereof.
U.S. Appl. No. 14/000,977 to Satoru Ohuchi et al., which was filed on Aug. 22, 2013.
Hyunbok Lee et al., "The origin of the hole injection improvements at indium tin oxide/molybdenum trioxide/N,N'-bis (1-naphthyl)-N,N'-diphenyl-1,1'-biphenyl-4,4'-diamine interface", Applied Physics Letters 93, 043308 (2008).
Kenji Koizumi et al., The electronic structure of alpha-NOD/MoO3 interface, Dai 56 kai Ouyou Butsurigaku Kankei Rengou Kouenaki Yokoushuu (Extended Abstracts for the 56th Spring Meeting of the Japan Society of Applied Physics and Related Societies), No. 3, 30p-ZA-11, The Japan Society of Applied Physics, p. 1279 (Apr. 2, 2009). Along with a verified English language translation.
Jingze Li et al., "Enhanced performance of organic light emitting device by insertion of conducting/insulating WO3 anodic buffer layer", Syntetic Metals 151, pp. 141-146 (2005).
Hiromi Watanabe et al., "Structure and Physical Property Evaluation of MoOX Thin-Film in Reactive Sputtering Method, and MoOX/α-NPD Boundary Analysis", (Nov. 20, 2008). Along with a verified English language partial translation.

Yasuo Nakayama et al., "MoO3 on F8BT Boundary Electron Structure: Research through Photoemission Spectrography and Meta-Stable Excited Atom Spectrometry", (Nov. 20, 2008). Along with a verified English language partial translation.
Min Jung Son et al., "Interface electronic structures of organic light-emitting diodes with WO3 interlayer: A study by photoelectron spectroscopy", Organic Electronics 10, pp. 637-642 (2009).
Kaname Kanai et al., "Electronic structure of anode interface with molybdenum oxide buffer layer", Organic Electronics 11, pp. 188-194 (2010).
F. Bussolotti et al, "Surface electronic properties of polycrystalline WO3 thin films• a study by core level and valence band photoemission", Surface Science 538, pp. 113-123 (2003).
Qin-Ye Bao et al., "Interfacial electronic structures of WO3-based intermediate connectors in tandem organic light-emitting diodes", Organic Electronics 11, pp. 1578-1583 (2010).
Th. Kugler et al., "Polymer band alignment at the interface with indium tin oxide: consequences for light emitting devices", Chemical Physics Letters 310, pp. 391-396 (1999).
I. N. Yakovkin et al., "Driving force for the WO3(001) surface relaxation", Surface Science 601, pp. 1481-1488 (2007).
J. B. Pedley et al., "Thermochemical Data for Gaseous Monoxides", Journal of Physical and Chemical Reference Data. vol. 12, No. 4, pp. 967-1032 (1983).
M. Stolze et al., "Nature of substoichiometry in reactively DC-sputtered tungsten oxide thin films and its effect on the maximum obtainable colouration by gases", Thin Solid Films 409, pp. 254-264 (2002).
V. Bulovic et al., "Transparent light-emitting devices", Nature, vol. 380, p. 29 (1996).
U.S. Appl. No. 13/205,748 to Kenji Harada et al., which was filed on Aug. 9, 2011.
U.S. Appl. No. 13/360,984 to Satoru Ohuchi et al., which was filed on Jan. 30, 2012.
U.S. Appl. No. 13/736,285 to Seiji Nishiyama et al., which was filed on Jan. 8, 2013.
U.S. Appl. No. 13/742,575 to Kenji Harada et al., which was filed on Jan. 16, 2013.
U.S. Appl. No. 13/742,593 to Kenji Harada et al., which was filed on Jan. 16, 2013.
U.S. Appl. No. 13/742,584 to Kenji Harada et al., which was filed on Jan. 16, 2013.
International Search Report in PCT/JP2010/000781, dated Apr. 6, 2010.
International Search Report in PCT/JP2010/004212, dated Aug. 3, 2010.
International Search Report in PCT/JP2010/004959, dated Nov. 9, 2010.
International Search Report in PCT/JP2010/004954, dated Sep. 7, 2010.
International Search Report in PCT/JP2010/004989, dated Sep. 7, 2010.
International Search Report in PCT/JP2010/004960, dated Nov. 9, 2010.
International Search Report in PCT/JP2010/004991, dated Nov. 16, 2010.
International Search Report in PCT/JP2011/006448, dated Feb. 21, 2012.
United States Office Action in U.S. Appl. No. 13/360,984, dated Mar. 1, 2013.

* cited by examiner

FIG. 10E
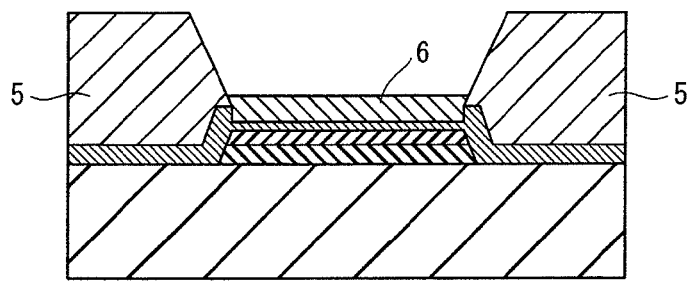
FIG. 10F
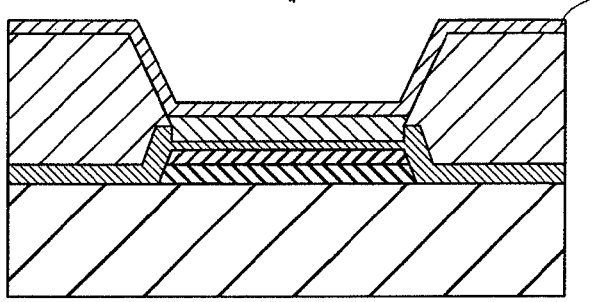
FIG. 10G
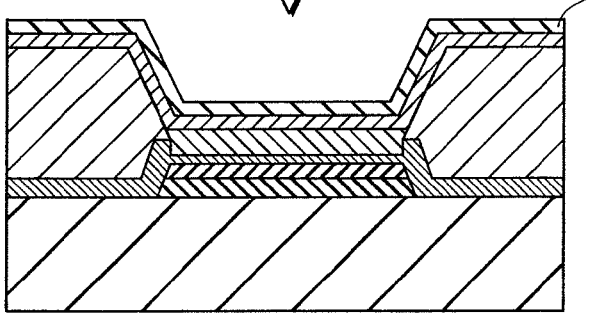
FIG. 10H
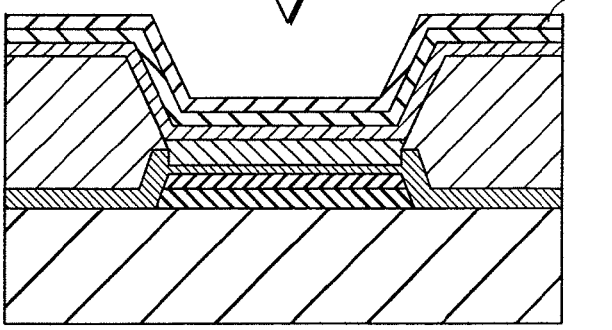

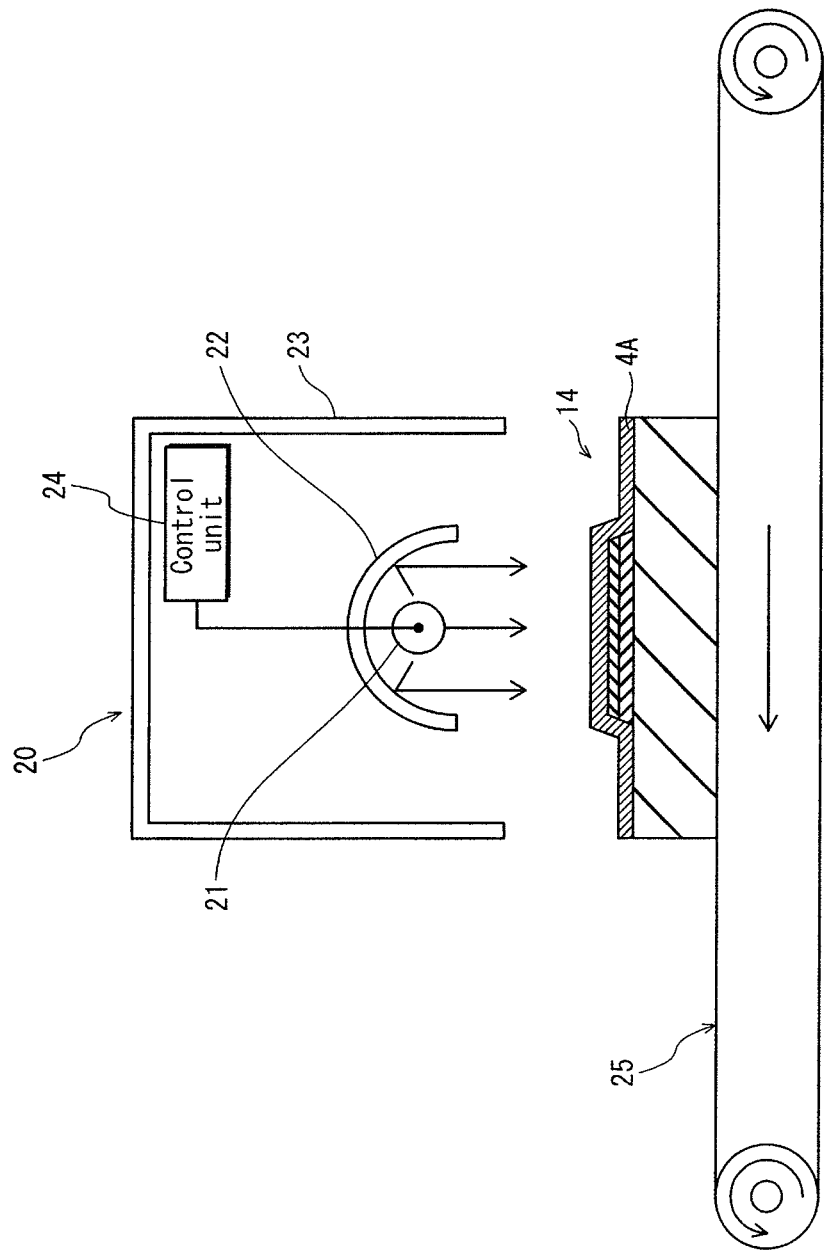

(001) surface

Inside of crystal

○ : Tungsten atom
◍ : Oxygen atom

ORGANIC EL ELEMENT, DISPLAY DEVICE, AND LIGHT-EMITTING DEVICE

CROSS REFERENCE TO RELATED APPLICATION

This is a continuation application of PCT Application No. PCT/JP2010/004960 filed Aug. 6, 2010, designating the United States of America, the disclosure of which, including the specification, drawings and claims, is incorporated herein by reference in its entirety.

TECHNICAL FIELD

The present disclosure relates to an organic electric-field light-emitting element (hereinafter referred to as an "organic EL element"), which is an electric light emitter. The present disclosure also relates to a display apparatus and a light-emitting apparatus each having an organic EL element.

DESCRIPTION OF THE RELATED ART

In recent years, progress is being made in research and development of diverse functional elements which involve the use of an organic semiconductor. One typical example of a functional element is an organic EL element. An organic EL element is a current-driven light emitter, and commonly has a pair of electrodes, namely an anode and a cathode, and a functional layer layered between the pair of electrodes. The functional layer includes a light-emitting layer composed of an organic material. Upon application of voltage across the pair of electrodes, holes injected from the anode to the functional layer recombine with electrons injected from the cathode to the functional layer. The recombination causes the phenomenon of electroluminescence, which involves emission of light. Being self-luminescent, an organic EL element is highly visible. In addition, being completely solid, an organic EL element has excellent impact resistance. Owing to these advantages, more attention is being given to the applications of organic EL elements as a light emitter or a light source for various display apparatuses.

To cause an organic EL element to emit light at high intensity, efficient injection of carriers (i.e., holes and electrons) from the electrodes to the functional layer is important. Generally, the provision of injection layers between each of the electrodes and a functional layer is effective in facilitating efficient injection of carriers. This is because an injection layer serves to lower the energy barrier to be overcome in the injection of carriers. An injection layer disposed between a functional layer and the anode is a hole-injection layer composed of an organic material, such as copper phthalocyanine or PEDOT (conductive polymer), or of a metal oxide, such as molybdenum oxide or tungsten oxide. An injection layer disposed between a functional layer and the cathode is an electron injection layer composed of an organic material, such as metal complex or oxadiazole, or of a metal, such as barium.

It has been reported that organic EL elements having a hole injection layer composed of a metal oxide, such as molybdenum oxide or tungsten oxide, exhibit improved hole injection efficiency and longevity (see Patent Literature 1 and Non-Patent Literature 1). It is further reported that the improvement achieved is relevant to the energy level resulting from structures similar to oxygen vacancies of metal oxide on the surface of the hole injection layer (see Non-Patent Literature 2).

CITATION LIST

Patent Literature

[Patent Literature 1]
Japanese Patent Application Publication No. 2005-203339
[Patent Literature 2]
Japanese Patent Application Publication No. 2003-249375

Non-Patent Literature

[Non-Patent Literature 1]
Jingze Li et al., Synthetic Metals 151, 141 (2005)
[Non-Patent Literature 2]
Kaname Kanai et al., Organic Electronics 11, 188 (2010)
[Non-Patent Literature 3]
J. B. Pedley et al., Journal of Physical and Chemical Reference Data 12, 967 (1983)
[Non-Patent Literature 4]
I. N. Yakovkin et al., Surface Science 601, 1481 (2007)

SUMMARY

In the manufacturing of an organic EL element, problems are presented by adherents, mainly carbon-containing adherents, derived from molecules of carbon dioxide, water, and organic material contained in the atmosphere or from molecules of impurities generated during the manufacturing steps. To be more specific, in a step of laminating the respective layers of an organic EL element, if a hole injection layer with adherents on its surface is topped with another layer, the adherents are embedded between the layers. The presence of adherents involves the risk of increasing the drive voltage of, and/or reducing the longevity of the resulting organic EL element.

In view of the above problems, non-limiting and exemplary embodiments provide an organic EL element, display apparatus, and light-emitting apparatus that each operate at low voltage to emit light at high intensity.

In one general aspect, the techniques disclosed here feature an organic EL element, comprising: an anode; a cathode; a functional layer that is disposed between the anode and the cathode and includes at least a light-emitting layer made of an organic material; a hole injection layer disposed between the anode and the functional layer; and a bank that defines a region in which the light-emitting layer is to be formed, wherein the hole injection layer contains tungsten oxide, an Ultraviolet Photoelectron Spectroscopy (UPS) spectrum, obtained from a UPS measurement, has a protrusion appearing near a Fermi surface and within a region corresponding to a binding energy range lower than a top of a valence band, the tungsten oxide contained in the hole injection layer satisfies a condition, determined from an X-ray Photoelectron Spectroscopy (XPS) measurement, that a ratio in a number density of atoms other than tungsten atoms and oxygen atoms to the tungsten atoms does not exceed approximately 0.83, the hole injection layer has a recessed portion in an upper surface thereof at the region defined by the bank, the recessed portion has (i) an inner bottom surface that is in contact with a bottom surface of the functional layer, and (ii) an inner side surface that is continuous with the inner bottom surface and in contact at least with part of a side surface of the functional layer, and the inner side surface of the recessed portion has a lower edge and an upper edge, the lower edge being continuous with the inner bottom surface, and the upper edge being one of (i)

aligned with part of a lower edge of the bank, the part being in contact with the light-emitting layer, and (ii) in contact with a bottom surface of the bank.

In the organic EL element according to one aspect of the present disclosure, the hole injection layer contains tungsten oxide and exhibits: by UPS measurement, a UPS spectrum having a protrusion appearing near a Fermi surface and within a region corresponding to a binding energy range lower than the top of a valence band; and by XPS measurement, that the tungsten oxide contained in the hole injection layer satisfies a condition that a ratio in number density of atoms other than tungsten atoms and oxygen atoms to the tungsten atoms does not exceed approximately 0.83. This configuration achieves the clean surface of the hole injection layer, by removing adherents without affecting the energy level resulting from structures similar to oxygen vacancies of tungsten oxide on the surface of the hole injection layer. Thus, the organic EL element operates at low voltage to emit light at high intensity.

In the case where the hole injection layer is composed of tungsten oxide having the aforementioned occupied energy level, the hole injection layer encounters a unique and new phenomenon. Specifically, during the manufacturing process of the hole injection layer, the thickness of the hole injection layer is reduced (hereinafter, also referred to as "film thinning"). The organic EL element according to one aspect of the present disclosure makes use of this phenomenon, and includes the hole injection layer that has a recessed portion in an upper surface thereof at the region defined by the bank. The recessed portion has (i) an inner bottom surface that is in contact with a bottom surface of the functional layer, and (ii) an inner side surface that is continuous with the inner bottom surface and in contact at least with part of a side surface of the functional layer. The inner side surface of the recessed portion has a lower edge and an upper edge, the lower edge being continuous with the inner bottom surface, and the upper edge being one of (i) aligned with part of a lower edge of the bank, the part being in contact with the light-emitting layer, and (ii) in contact with a bottom surface of the bank. Accordingly, in a manufacturing process, the recessed portion can accumulate drops of ink that have been ejected in the region defined by the bank.

In addition, the hole injection layer contains tungsten oxide which is liquid-philic as compared to the surface of the bank. This improves the wettability of the inner surface of the recessed portion with respect to ink. As a result, the ink within the recessed portion can be stably held within the recessed portion. Therefore, the drops of the ink do not easily overflow from the bank into an adjacent pixel region, enabling high-definition patterning of the functional layer. Furthermore, the recessed portion can be easily formed by, for example, melting part of the hole injection layer with pure water. Also, unlike a light emitter of Patent Literature 2, a complicated process for making a two-layer bank is unnecessary. This makes it possible to realize the organic EL element according to one aspect of the present disclosure at low price.

These general and specific aspects may be implemented using a manufacturing method.

Additional benefits and advantages of the disclosed embodiments will be apparent from the specification and figures. The benefits and/or advantages may be individually provided by the various embodiments and features of the specification and drawings disclosed, and need not all be provided in order to obtain one or more of the same.

BRIEF DESCRIPTION OF DRAWINGS

FIGS. 10E to 10H are processing drawings for explaining the method of manufacturing the organic EL element according to Embodiment 1, which follows FIG. 9D.

FIG. 11 is for explaining an ultraviolet irradiation process.

FIG. 29A is a longitudinal sectional view, and FIG. 29B is a transverse sectional view.

DETAILED DESCRIPTION

Figure 1:
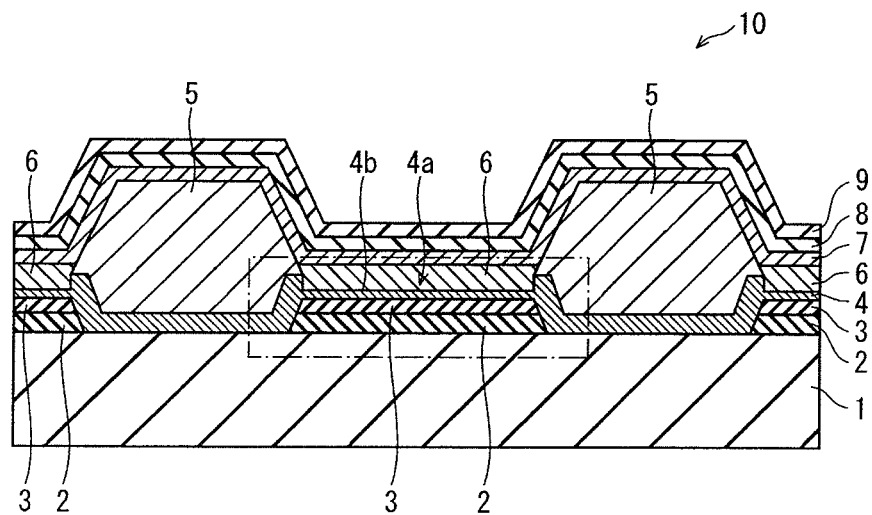
FIG. 1 is a schematic view showing a layered condition of layers constituting an organic EL element according to Embodiment 1.

Outline of Aspects of the Present Disclosure

One aspect of the present disclosure is an organic EL element, comprising: an anode; a cathode; a functional layer that is disposed between the anode and the cathode and includes at least a light-emitting layer made of an organic material; a hole injection layer disposed between the anode and the functional layer; and a bank that defines a region in which the light-emitting layer is to be formed, wherein the hole injection layer contains tungsten oxide, an Ultraviolet Photoelectron Spectroscopy (UPS) spectrum, obtained from a UPS measurement, has a protrusion appearing near a Fermi surface and within a region corresponding to a binding energy range lower than a top of a valence band, the tungsten oxide contained in the hole injection layer satisfies a condition, determined from an X-ray Photoelectron Spectroscopy (XPS) measurement, that a ratio in a number density of atoms other than tungsten atoms and oxygen atoms to the tungsten atoms does not exceed approximately 0.83, the hole injection layer has a recessed portion in an upper surface thereof at the region defined by the bank, and an inner side surface of the recessed portion is in contact with the functional layer.

Regarding the organic EL element, in the UPS spectrum, the protrusion may appear within the region corresponding to the binding energy range from approximately 1.8 eV to approximately 3.6 eV lower than the top of the valance band.

Note that a numerical range stated as "from . . . to . . . " is intended to mean that the upper and lower limits are both inclusive. For example, the numerical range "from 1.8 eV to 3.6 eV" includes both 1.8 eV and 3.6 eV.

Also, in the organic EL element, the ratio in the number density of the other atoms to the tungsten atoms may not exceed approximately 0.62. In this case, the adherent removal effect is assumed to have reached a level of saturation, so that a sufficient adherent removal effect is expected to be achieved.

In the organic EL element, the atoms other than tungsten atoms and oxygen atoms may comprise carbon atoms.

Also, in the organic EL element, the bank may be liquid-repellent, and the hole injection layer may be liquid-philic. Note that, terms "liquid-philic" and "liquid-phobic" are each used in a relative sense. As described above, the bank may be liquid-repellent at least on its surface. In contrast, the hole injection layer may be formed with a liquid-philic metal compound. In such a case, the surface of the hole injection layer is more liquid-philic than the surface of the bank, and the surface of the bank is more liquid-repellent than the surface of the hole injection layer. Also, the surface of the hole injection layer with liquid-philicity relatively has high wettability to ink, and the surface of the bank with liquid-repellency relatively has low wettability to the ink. Note that, liquid-philicity and liquid-repellency can be defined by a contact angle at which the ink meets the surface of the bank or the hole injection layer. For example, when the contact angle is equal to or smaller than 10°, the surface is defined to have liquid-philicity, and when the contact surface is equal to or greater than 35°, the surface is defined to have liquid-repellency.

In the organic EL element, the hole injection layer may be irradiated with ultraviolet light so that the hole injection layer, in the UPS spectrum, obtained by the UPS measurement, has the protrusion appearing near the Fermi surface and within the region corresponding to the binding energy range lower than the top of the valence band, and the tungsten oxide contained in the hole injection layer satisfies the condition, as determined by the XPS measurement, that the ratio in the number density of atoms other than tungsten atoms and oxygen atoms to the tungsten atoms does not exceed approximately 0.83.

One aspect of the present disclosure is an organic EL element, comprising: an anode; a cathode; a functional layer that is disposed between the anode and the cathode and includes at least a light-emitting layer made of an organic material; a hole injection layer disposed between the anode and the functional layer; and a bank that defines a region in which the light-emitting layer is to be formed, wherein the hole injection layer contains tungsten oxide, an Ultraviolet Photoelectron Spectroscopy (UPS) spectrum, obtained from a UPS measurement, has a protrusion appearing near a Fermi surface and within a region corresponding to a binding energy range lower than a top of a valence band, a peak appears within a region corresponding to a binding energy range from approximately 4.5 eV to approximately 5.4 eV, the hole injection layer has a recessed portion in an upper surface thereof at the region defined by the bank, the recessed portion has (i) an inner bottom surface that is in contact with a bottom surface of the functional layer, and (ii) an inner side surface that is continuous with the inner bottom surface and in contact at least with part of a side surface of the functional layer, and the inner side surface of the recessed portion has a lower edge and an upper edge, the lower edge being continuous with the inner bottom surface, and the upper edge being one of (i) aligned with part of a lower edge of the bank, the part being in contact with the light-emitting layer, and (ii) in contact with a bottom surface of the bank.

Regarding the organic EL element according to the above aspect of the present disclosure, in the UPS spectrum, the protrusion may appear within the region corresponding to the binding energy range from approximately 1.8 eV to approximately 3.6 eV lower than the top of the valance band.

In the organic EL element, the hole injection layer may be irradiated with ultraviolet light so that the hole injection layer, in the UPS spectrum, obtained by the UPS measurement, has the protrusion appearing near the Fermi surface and within the region corresponding to the binding energy range lower than the top of the valence band, and the peak appears within the region corresponding to the binding energy range from approximately 4.5 eV to approximately 5.4 eV.

Also, in the organic EL element, the bank may be liquid-repellent, and the hole injection layer may be liquid-philic.

One aspect of the present disclosure is a display apparatus comprising any of the organic EL elements as described above.

One aspect of the present disclosure is a light-emitting apparatus comprising any of the organic EL elements as described above.

EMBODIMENTS

The following describes an organic EL element, a manufacturing method therefor, a display apparatus, and a light-emitting apparatus all according to one aspect of the present disclosure. Subsequently, the results of experiments conducted to confirm the performance of the organic EL element are described, followed by observations on the experimental results. Note that each figure is illustrated on a reduced scale different from the proportion of the actual sizes.

Embodiment 1

Schematic Structure of Organic EL Element

Figure 2:
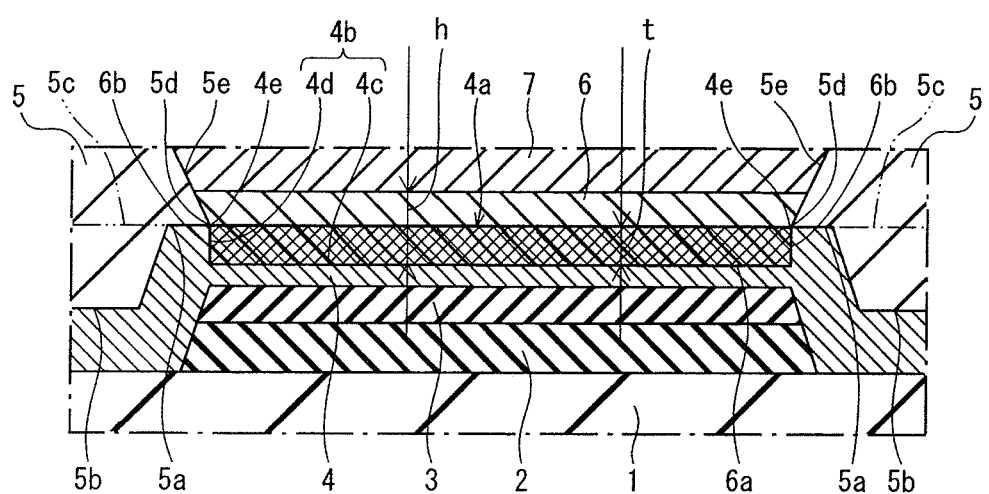
FIG. 2 is an enlarged view of a part enclosed with a dashed line in FIG. 1.

FIG. 1 is a schematic view showing a layered condition of layers constituting an organic EL element according to Embodiment 1, and FIG. 2 is an enlarged view of a part enclosed with a dashed line in FIG. 1.

As shown in FIG. 1, an organic EL element 10 according to Embodiment 1 is a top emission type organic EL element including RGB pixels that are arranged in a matrix or in line. Each pixel includes layers which are disposed on a substrate 1.

On the substrate 1, which is a TFT substrate, an anode 2 is formed together with other anodes 2 in a matrix or in line. On each anode 2, an indium tin oxide (ITO) layer 3 and a hole injection layer 4 as a charge injection transport layer are layered in this order. The ITO layer 3 is disposed only on the anode 2, whereas the hole injection layer 4 is formed not only on the anode 2 but also over the substrate 1.

On the hole injection layer 4, a bank 5 that defines pixels is formed, and in a region defined by the bank 5, a light-emitting layer 6 is disposed. Furthermore, on the light-emitting layer 6, an electron injection layer 7, a cathode 8, and a passivation layer 9 are formed so as to be continuous with respective layers of an adjacent pixel, passing over the region defined by the bank 5.

(Structure of Organic EL Element)

The substrate 1 is made from an insulating material such as alkali-free glass, soda glass, nonluminescent glass, phosphate glass, boric-acid glass, quartz, acrylic resin, styrene resin, polycarbonate resin, epoxy resin, polyethylene, polyester, silicone resin, and alumina.

For example, the anode 2 is formed with Ag (silver), APC (alloy of silver, palladium, and copper), ARA (alloy of silver, rubidium, and gold), MoCr (alloy of molybdenum and chromium), NiCr (alloy of nickel and chromium), etc. In the case of a top emission type organic EL element, it is preferable that the anode 2 be formed with a light-reflective material. The anode 2 and the cathode 8 are connected to a DC voltage source (not shown) to supply power to the organic EL element 10 from the outside.

In one example, the ITO layer 3 has a thickness of 50 nm and is disposed between the anode 2 and the hole injection layer 4 and has a function of guaranteeing excellent bondability between the anode 2 and the hole injection layer 4.

In one example, the hole injection layer 4 is a thin film (layer) having a thickness of 30 nm and composed of tungsten oxide (WOx). In the formula (WOx) representing the composition of tungsten oxide, x is a real number generally falling within the range of $2<x<3$. It is preferable that the hole injection layer 4 consist only of tungsten oxide. However, the inclusion of a trace level of impurities is acceptable, provided that the amount does not exceed the amount of impurities which may be incorporated as a result of normal processing.

As shown in FIG. 2, the hole injection layer 4 extends along the bottom surface of the bank 5 to an adjacent pixel. Also, a portion of the hole injection layer 4 in a region defined by the bank 5 has a recessed structure in which the portion of the hole injection layer 4 is lower than the bottom surface of the bank 5, and includes a recessed portion 4a (indicated with mesh hatching in FIG. 2) formed by being dissolved by a predetermined solvent. In addition, with regard to the hole-injection layer 4, only a film thickness in the region defined by the bank 5 is smaller than a film thickness in other regions, and the film thickness in the other regions is entirely and substantially uniform. Since the hole injection layer 4 is formed with tungsten oxide having liquid-philicity, an inner surface 4b of the recessed portion 4a has excellent wettability to ink. This allows for drops of the ink ejected into the region defined by the bank 5 to easily adhere to the inner surface 4b of the recessed portion 4a, and the drops of the ink easily stay within the region defined by the bank 5.

Note that the hole injection layer 4 only has to have a recessed structure according to which the recessed portion 4a is lower than an edge portion 5a of the bottom surface of the bank 5, and does not have to be lower than the entire bottom surface of the bank 5. In the recessed structure of the present embodiment, the recessed portion 4a is lower than the edge portion 5a of the bottom surface of the bank 5 but not lower than a central part 5b of the bottom surface of the bank 5. Alternatively, for example, by setting the central part 5b as high as the edge portion 5a and planarizing the bottom surface of the bank 5, as shown by an alternate long and two short dashes line 5c in FIG. 2, it is possible to have the recessed structure according to which the recessed portion 4a is lower than the entire bottom surface of the bank 5.

The hole injection layer 4 has a recessed structure according to which a portion of the hole injection layer 4 is lower than a lower edge 5d of the bank 5. To be specific, an upper surface of the hole injection layer 4, which is defined by the bank 5, is sunken from a level of the lower edge 5d in a direction substantially vertical to the upper surface of the substrate 1. Like this, in the case of the recessed structure according to which the portion of the hole injection layer 4 is lower than the lower edge 5d of the bank 5, a film thickness of the light-emitting layer 6 can be uniform over a wide range, and as a result, irregular luminance is not likely to occur in the light-emitting layer 6.

Figure 4:
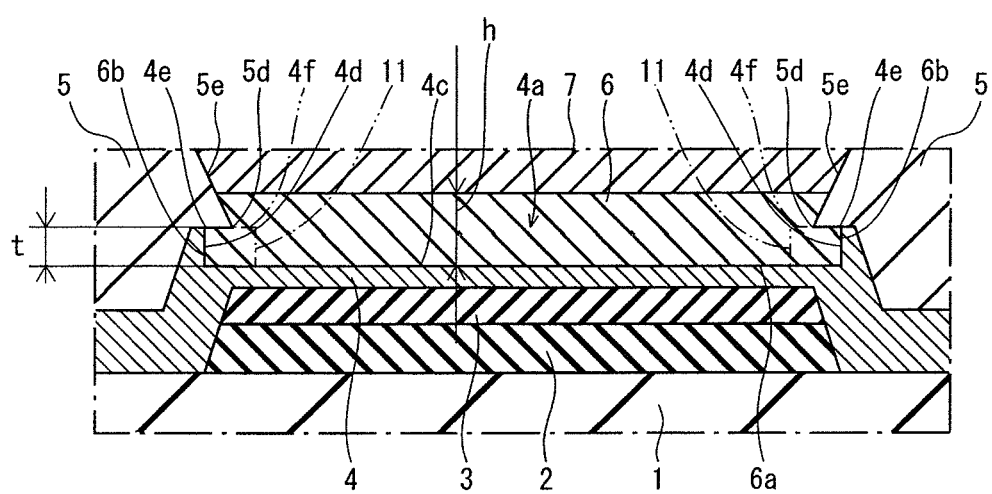
FIG. 4 is an enlarged view of a part enclosed with a dashed line in FIG. 1, with respect to a light emitter according to a modification.

Alternatively, the hole injection layer 4 is not limited to having the recessed structure according to which a portion of the hole injection layer 4 is lower than the lower edge 5d of the bank 5. For example, as shown in FIG. 4, an upper edge 4e of an inner side surface 4d of the recessed portion 4a may not be aligned with the lower edge 5d of the bank 5, and the upper edge 4e may be closer to an adjacent pixel than the lower edge 5d of the bank 5 is. Furthermore, the hole-injection layer 4 may have a recessed structure in which the upper edge 4e of the inner side surface 4d of the recessed portion 4a is not aligned with the lower edge 5d of the bank 5, and the upper edge 4e is closer to the center of the pixel than the lower edge 5d of the bank 5 is. In such a case, a profile of the recessed portion 4a is as shown by an alternate long and two short dashes line 11 in FIG. 4.

The recessed structure of the hole injection layer 4 has a cup-like shape. To be more specific, the inner surface 4b of the recessed portion 4a is composed of an inner bottom surface 4c and the inner side surface 4d. The inner bottom surface 4c is substantially parallel with the upper surface of the substrate 1 and is flat. Also, the inner bottom surface 4c is in contact with a bottom surface 6a of the light-emitting layer 6. The inner side surface 4d extends from an edge of the inner bottom surface 4c in a direction perpendicular to the upper surface of the substrate 1 and is in contact with a side surface 6b of the light-emitting layer 6. When the recessed structure has a cup-like shape, the inner side surface 4d prevents the drops of the ink within the recessed portion 4a from moving in a direction parallel to the upper surface of the substrate 1. Accordingly, it is possible to more stably hold the drops of the ink within the region defined by the bank 5. Accordingly, it is possible to more stably hold the drops of the ink within the region defined by the bank 5. Moreover, when the recessed structure has the cup-like shape, the inner surface 4b of the recessed portion 4a becomes larger in area, and a contact surface of the drops of the ink and the hole injection layer 4 becomes larger in area. Accordingly, it is possible to more stably hold the drops of the ink within the region defined by the bank 5. Therefore, high-definition patterning of the light-emitting layer 6 is possible.

As described above, in the present embodiment, the bank 5 and the hole injection layer 4 are connected to each other in a substantially vertical direction, whereby the inner bottom surface 4c of the hole injection layer 4 is easily wettable by ink. This makes it possible to form the light-emitting layer 6 with excellent efficiency. Here, when the hole injection layer 4 does not have the recessed portion 4a, the boundary portion between the bank 5 and the hole injection layer 4 is not easily wettable by ink. Accordingly, the light-emitting layer 6 might not be fully formed at the bottom surface thereof, and as a result, electrical leakage might occur. That is, a technical meaning resides in that the hole injection layer 4 has the recessed portion 4a, and the bank 5 and the hole injection layer 4 are connected to each other in the substantially vertical direction in order to excellently form the light-emitting layer 6.

Note that, in the case that the bank 5 and the hole injection layer 4 are connected to each other in the substantially vertical direction, the interface between the bank 5 and the hole injection layer 4 does not always need to be horizontal but may be oblique.

Figure 3A:
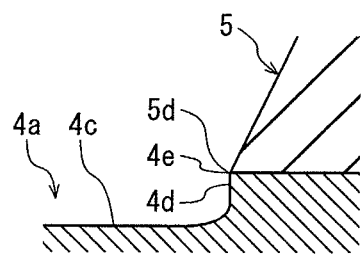
FIGS. 3A-3D are schematic views for explaining the shape of a recessed portion.
Figure 3B:
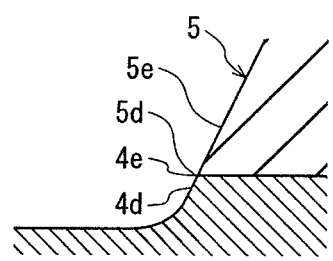
Figure 3C:
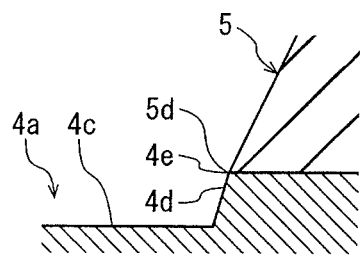
Figure 3D:
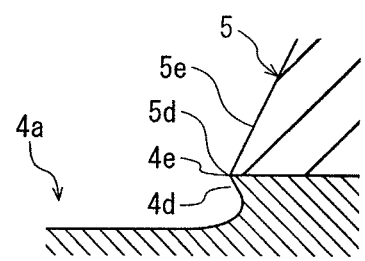

The following explains the recessed structure of the hole injection layer 4 in more detail. As shown in FIG. 3A, the inner side surface 4d of the recessed portion 4a has a lower edge that is continuous with the inner bottom surface 4c and an upper edge 4e that is continuous with the lower edge. The upper edge 4e of the inner side surface 4d of the recessed portion 4a is aligned with the lower edge 5d of the bank 5 that is in contact with the light-emitting layer 6. The part where the inner side surface 4d and the inner bottom surface 4c are continuous is rounded. Note that, when the upper edge 4e of the inner side surface 4d is aligned with the lower edge 5d of the bank 5, the recessed portion 4a is not limited to the shape shown in FIG. 3A, in which the inner side surface 4d is substantially vertical to the inner bottom surface 4c. As shown in FIG. 3B, the inner side surface 4d and a side surface 5e of the bank 5 may have substantially the same inclination and extend on the same plane. As shown in FIG. 3C, the part where the inner side surface 4d and the inner bottom surface 4c are continuous may not be rounded. As shown in FIG. 3D, the inner side surface 4d may be inclined opposite to the side surface 5e of the bank 5 so as to go under the bank 5.

Figure 5A:
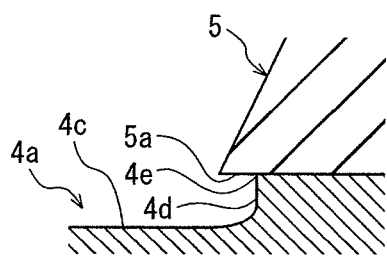
FIGS. 5A-5D are schematic views for explaining the shape of a recessed portion.
Figure 5B:
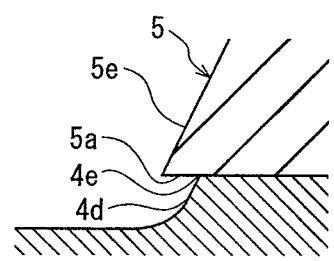
Figure 5C:
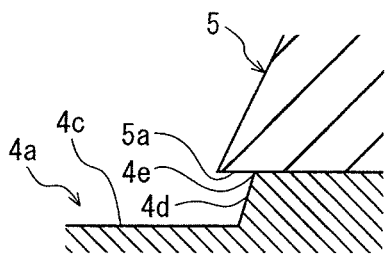
Figure 5D:
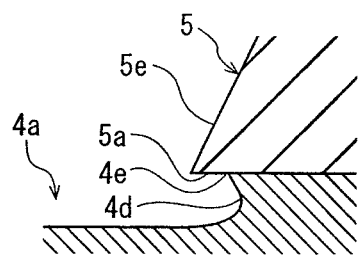

Alternatively, the hole injection layer 4 is not limited to having the recessed structure according to which a portion of the hole injection layer 4 is lower than lower edge 5d of the bank 5. For example, as shown in FIG. 4, the upper edge 4e of the inner side surface 4d may not be aligned with the lower edge 5d of the bank 5, and the upper edge 4e may be closer to an adjacent pixel than the lower edge 5d of the bank 5 is. In such a case, as shown in FIG. 5A, the inner side surface 4d of the recessed portion 4a has the upper edge 4e that is in contact with the edge portion 5a of the bank 5. Note that, when the upper edge 4e of the inner side surface 4d is in contact with the edge portion 5a of the bank 5, the recessed portion 4a is not limited to the shape shown in FIG. 5A, in which the inner side surface 4d is substantially vertical to the inner bottom surface 4c. As shown in FIG. 5B, the inner side surface 4d and the side surface 5e of the bank 5 may have a substantially same inclination. As shown in FIG. 5C, the part where the inner side surface 4d and the inner bottom surface 4c are continuous may not be rounded. As shown in FIG. 5D, the inner side surface 4d may be inclined opposite to the side surface 5e of the bank 5 so as to go under the bank 5.

Concerning the inner side surface 4d, the upper edge 4e either meets the lower edge 5d of the bank 5 or is in contact with the edge portion 5a of the bank 5. Accordingly, a short circuit is not likely to occur between the anode 2 and the cathode 8. Supposedly, as shown by the alternate long and two short dashes line 11 in FIG. 4, when the upper edge 4e of the inner side surface 4d is not aligned with the lower edge 5d of the bank 5 and the upper edge 4e is closer to the center of the pixel than the lower edge 5d is, a short circuit might occur between the anode 2 and the cathode 8 via an exposed area 4f that is a part of an upper surface of the hole injection layer 4 and is exposed from the bank 5. Especially, as described later, when an average thickness h of the light-emitting layer 6 is smaller than or equal to an average depth t of the recessed portion 4a, the exposed area 4f of the hole injection layer 4, which is a part of an upper surface of the hole injection layer 4 and is uncovered with the bank 5, might be in contact with the electron injection layer 7 or the cathode 8. Accordingly, a short circuit might occur between the anode 2 and the cathode 8.

Returning to FIG. 2, although the present disclosure does not specifically specify the average depth t of the recessed portion 4a, the average depth t may be 5 nm-100 nm, for example. If the average depth t of the recessed portion 4a is equal to or greater than 5 nm, it is possible to hold sufficient amount of the ink within the recessed portion 4a. Accordingly, it is possible to stably maintain the ink within the region defined by the bank 5. Furthermore, since the light-emitting layer 6 is formed up to the edge of the bank 5 without being rejected, the short circuit between the anode 2 and the cathode 8 can be prevented.

Note that, the average depth t of the recessed portion 4a can be obtained by measuring a surface profile of the hole-injection layer 4 with use of a stylus profiler meter or an AFM (Atomic Force Microscope), and calculating a difference between an average height of a portion that is a crest and an average height of a portion that is a trough based on the surface profile.

The film thickness of the light-emitting layer 6 is not specifically determined. However, if the average thickness h of the light-emitting layer 6 after dried is equal to or greater than 100 nm and the average depth t of the recessed portion 4a is equal to or smaller than 100 nm, for example, it is possible to uniform a film thickness of the light-emitting layer 6 at the region defined by the bank 5.

Figure 6A:
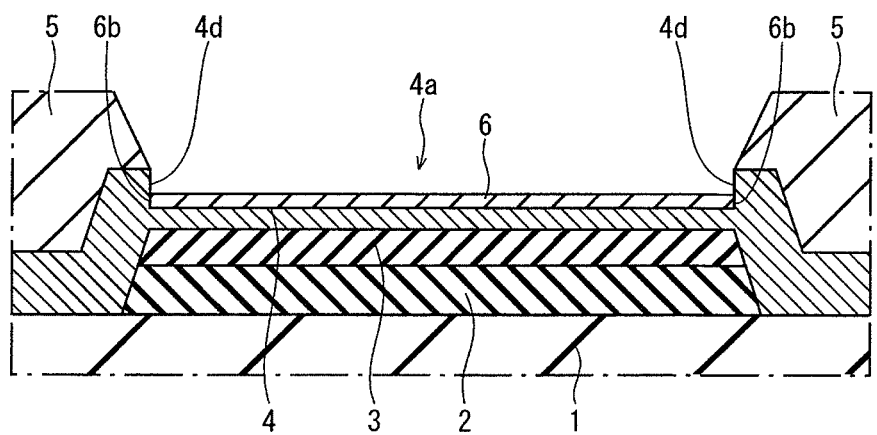
FIGS. 6A and 6B are schematic views for explaining an exemplary thickness of a light-emitting layer.
Figure 6B:
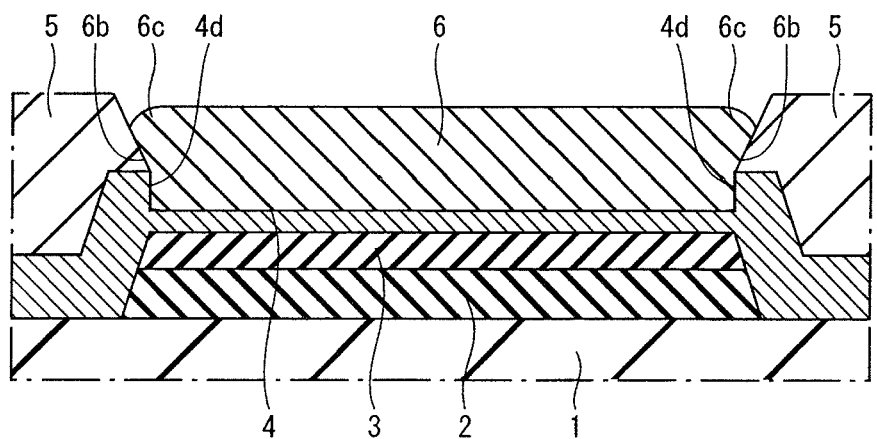

Furthermore, it is preferable that a difference between the average thickness h of the light-emitting layer 6 and the average depth t of the recessed portion 4a is equal to or smaller than 20 nm. When the average thickness h of the light-emitting layer 6 is much smaller than the average depth t of the recessed portion 4a (for example, t−h>20 nm), a portion that is out of contact with the light-emitting layer 6 (portion not covered with the light-emitting layer 6) is formed at the inner side surface 4d of the recessed portion 4a, as shown in FIG. 6A. Then a short circuit might occur between the anode 2 and the cathode 8. On the other hand, when the average thickness h of the light-emitting layer 6 is much greater than the average depth t of the recessed portion 4a (for example, h−t>20 nm), liquid-repellency of the bank 5 causes a film thickness of a bank vicinity portion 6c of the light-emitting layer 6 to become smaller than other portions, as shown in FIG. 6B. As a result, a cross-sectional shape of the light-emitting layer 6 has a substantially convex shape, and this might result in irregular light emission caused by a difference of film thickness.

Note that the inner side surface 4d of the recessed portion 4a only has to be in contact with at least a part of the side surface 6b of the light-emitting layer 6. For example, as shown in FIG. 2 and FIG. 6B, when the average thickness h of the light-emitting layer 6 is equal to or greater than the average depth t of the recessed portion 4a, only a part of a lower part of the side surface 6b of the light-emitting layer 6 is in contact with the inner side surface 4d of the recessed portion 4a. On the other hand, as shown in FIG. 6A, when the average thickness h of the light-emitting layer 6 is smaller than the average depth t of the recessed portion 4a, the side surface 6b of the light-emitting layer 6 is entirely in contact with the inner side surface 4d of the recessed portion 4a.

Figure 7:
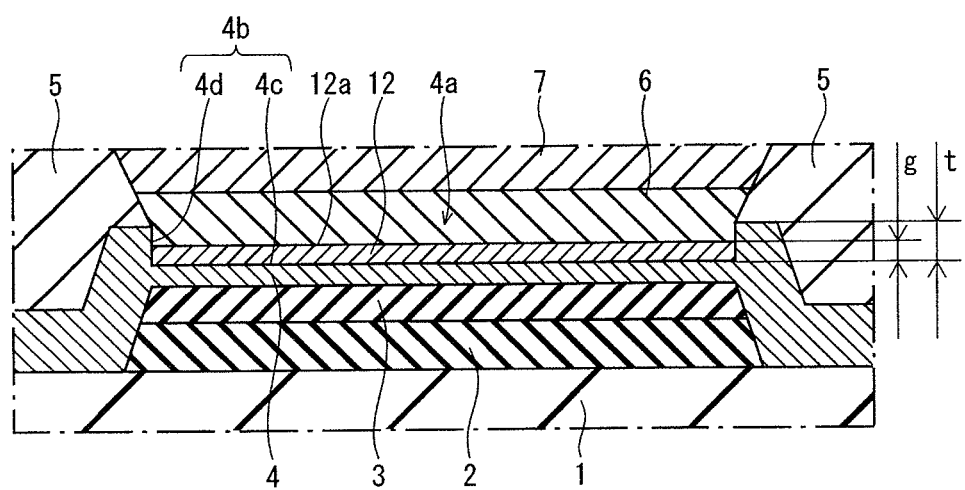
FIG. 7 is an enlarged view of a part enclosed with a dashed line in FIG. 1, with respect to a light emitter according to a modification.

As shown in FIG. 7, a hole transport layer 12 composing the functional layer may be formed under the light-emitting layer 6. More specifically, the hole transport layer 12 may be formed inside the recessed portion 4a of the hole injection layer 4. The hole transport layer 12 is a liquid-philic layer such as an IL layer (intermediate layer). In this case, the drops of the ink are ejected not on the inner bottom surface 4c of the recessed portion 4a but on an upper surface 12a of the hole transport layer 12. However, since the upper surface 12a is liquid-philic, it is possible to stably hold the drops of the ink within the region defined by the bank 5. However, if the recessed portion 4a is totally filled with the hole transport layer 12, the inner side surface 4d of the recessed portion 4a becomes out of contact with the ink. Accordingly, an average thickness g of the hole transport layer 12 is preferably smaller than the average depth t of the recessed portion 4a. In addition to the function of transporting holes, the IL layer may further include a function of blocking electrons and/or a function of adjusting optical characteristics.

The hole transport layer 12 has a thickness of approximately 10 nm to 20 nm. The hole transport layer 12 transports holes injected from the hole injection layer 4 into the light-emitting layer 6. The hole transport layer 12 is made of an organic material having hole transport properties. The organic material having hole transport properties is an organic substance having the property of conducting holes via an intermolecular charge-transfer reaction. The organic substance is sometimes referred to as a p-type organic semiconductor.

The hole transport layer 12 may be formed with either a high molecular material or a low molecular material, and is formed by wet printing. It may be preferable, for example, that the hole transport layer 12 includes a crosslinking agent. In this way, when the light-emitting layer 6 is formed on the hole transport layer 12, the hole transport layer 12 is less likely to be dissolved into the light-emitting layer 6. The material having hole transport properties may be a copolymer of fluorene and triarylamine units, or a triarylamine with low molecular weight, for example. The crosslinking agent may be dipentaerythritol hexaacrylate, for example. In this case, the hole transport layer 12 is desirably formed with poly(3, 4-ethylenedioxythiophene) doped with polystyrene sulfonic acid (PEDOT-PSS) or a derivative (copolymer, etc.) thereof.

By being formed under predetermined conditions, a surface (including the inner surface 4b of the recessed portion 4a) of the hole injection layer 4 has an electron level with structures similar to oxygen vacancies of tungsten oxide. The presence of the energy level enables effective hole injections. In addition, subsequently to the layer formation, the hole injection layer 4 is irradiated with ultraviolet light of a predetermined wavelength in the atmosphere. As a result of the ultraviolet (UV) irradiation, the surface (including the inner surface 4b of the recessed portion 4a) of the hole injection layer 4 is cleaned to reduce adherents thereon, without affecting the energy level resulting from the structures similar to oxygen vacancies of tungsten oxide. In addition, the duration and intensity of UV irradiation is set so that, with respect to a photoelectron spectrum exhibited by the hole injection layer 4 after the UV irradiation, changes in shape of a spectral region corresponding to a predetermined range of binding energy converge (note that in the present disclosure, the expression "converge" is used with the intention of indicating a state where the shape of the spectral region no longer changes. With the setting, the maximum effect of removing adherents is achieved by UV irradiation performed at the minimum conditions.

The bank 5 is formed with an organic material such as resin or an inorganic material such as glass and has insulating properties. Examples of the organic material include acrylic resin, polyimide resin, novolac-type phenolic resin, etc. Examples of the inorganic material include silicon oxide ($SiO_2$), silicon nitride ($Si_3N_4$), etc. It may be preferable, for example, that the bank 5 has organic solvent resistance, and have certain light transparency to visible light. Furthermore, since the bank 5 may be etched, baked, etc. when formed, it may be preferable, for example, that the bank 5 is formed with a material highly resistant to the etching and baking processes.

It is desirable that at least the surface of the bank 5 is provided with liquid-repellency. Accordingly, when the bank 5 is formed with a liquid-philic material, it is necessary that the surface of the bank 5 is subjected to, for example, a liquid-repellent treatment in order to make the surface of the bank 5 liquid-repellent.

Note that the bank 5 may be a pixel bank or a line bank. In the case of a pixel bank, the bank 5 is formed to surround the whole circumference of the light-emitting layer 6 for each pixel. In the case of a line bank, the bank 5 is formed to separate a plurality of pixels into columns or rows. In that case, the bank 5 is arranged to be on both sides of the light-emitting layer 6 along the direction in which the columns or rows align, and the light-emitting layer 6 is continuous in each column or line.

The light-emitting layer 6 is a light-emitting layer that emits light as a result of recombination of injected holes and electrons. The light-emitting layer 6 is, for example, a 70 nm-thick layer of F8BT (poly(9,9-di-n-octylfluorene-alt-benzothiadiazole)), which is an organic polymer. However, the material of the light-emitting layer 6 is not limited to this, and the light-emitting layer 6 may contain a commonly-known organic material. It is preferable that the light-emitting layer 6 be made from a fluorescent material such as an oxinoid compound, perylene compound, coumarin compound, azacoumarin compound, oxazole compound, oxadiazole compound, perinone compound, pyrrolo-pyrrole compound, naphthalene compound, anthracene compound, fluorene compound, fluoranthene compound, tetracene compound, pyrene compound, coronene compound, quinolone compound and azaquinolone compound, pyrazoline derivative and pyrazolone derivative, rhodamine compound, chrysene compound, phenanthrene compound, cyclopentadiene compound, stilbene compound, diphenylquinone compound, styryl compound, butadiene compound, dicyanomethylene pyran compound, dicyanomethylene thiopyran compound, fluorescein compound, pyrylium compound, thiapyrylium compound, selenapyrylium compound, telluropyrylium compound, aromatic aldadiene compound, oligophenylene compound, thioxanthene compound, anthracene compound, cyanine compound, acridine compound, metal complex of a 8-hydroxyquinoline compound, metal complex of a 2-bipyridine compound, complex of a Schiff base and a group three metal, metal complex of oxine, rare earth metal complex, etc., as recited in Japanese Patent Application Publication No. 5-163488. When the light-emitting layer 6 includes a layer formed with a high-polymer material, the light-emitting layer 6 can be formed by a printing technology such as an ink-jet method, and a nozzle coating method. Accordingly, compared with a deposition method using a low-molecular material, is it possible to easily contribute to cost reduction.

The electron injection layer 7 has the function of transporting electrons injected from the cathode 8 to the light-emitting layer 6. For example, the electron injection layer 7 has a thickness of 5 nm, and is desirably formed from barium, phthalocyanine, lithium fluoride, or a combination thereof.

For example, the cathode 8 has a thickness of 100 nm, and is made of aluminum, ITO, or IZO (indium zinc oxide). In the case of a top emission type organic EL element, such as the organic EL element 10, it is desirable that the cathode 8 be formed from a light-transmissive material.

The passivation layer 9 has a function of preventing the light-emitting layer 6 and so on from being exposed to moisture and air. The passivation layer 9 is made from a material such as SiN (silicon nitride) and SiON (silicon oxynitride), and is disposed such that the organic EL element 10 is sealed therein. In the case of a top emission type organic EL element, such as the organic EL element 10, it is desirable that the passivation layer 9 be formed from a light-transmissive material. Note that a sealing cap may be provided to isolate the entire organic EL element 10 from external space. When using a sealing cap, the sealing cap may be formed by using, for instance, the same material as the substrate 1, and a getter which absorbs moisture and the like may be provided within the sealed space formed by the substrate 1 and the sealing cap.

Figure 8:
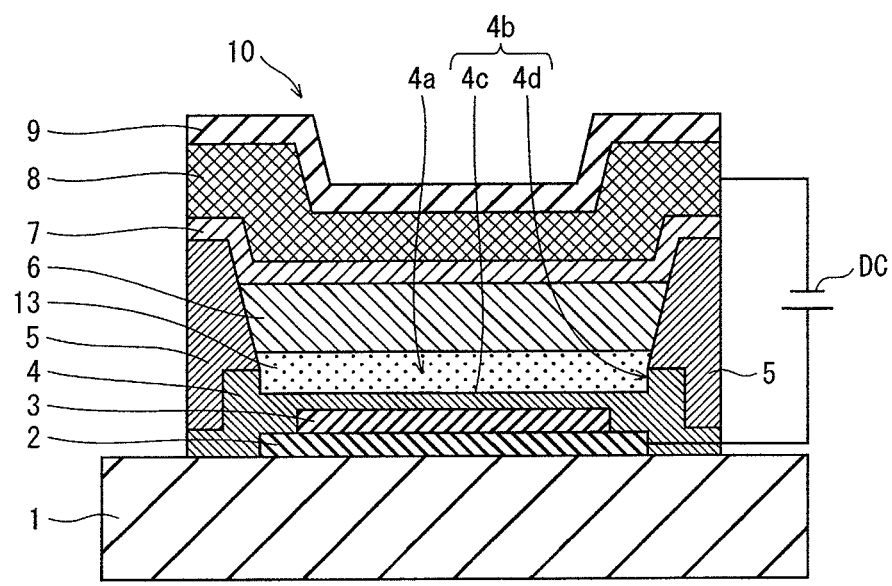
FIG. 8 is a schematic cross-sectional view illustrating a structure of an organic EL element according to a modification.

As shown in FIG. 8, it is possible to provide a buffer layer 13 for the organic EL element 10 according to Embodiment 1. Specifically, the buffer layer 13 is provided between the hole injection layer 4 and the light-emitting layer 6, and serves to adjust optical characteristics and/or block electrons. In one example, the buffer layer 13 is a 20 nm-thick layer of TFB (poly(9,9-di-n-octylfluorene-alt-(1,4-phenylene-((4-sec-butylphenyl)imino)-1,4-phenylene)), which is an amine-containing organic polymer.

The buffer layer 13 may have a function of transporting holes, in addition to the function of adjusting optical characteristics and/or blocking electrons. In this respect, the buffer layer 13 may serve as a functional layer, similarly to the IL layer in FIG. 7.

The functional layer in the present disclosure is either one, a combination of two or more, or every one of layers such as the following: a hole transport layer, a light-emitting layer, a buffer layer, an electron injection layer, and an electron transport layer. Although the present disclosure is directed to a hole injection layer, an organic EL element commonly includes layers having the functions of the hole transport layer, light-emitting layer and the like described above, in addition to the hole injection layer. As such, the expression "functional layer" refers to all such layers which need to be included in the organic EL element, aside from the hole injection layer to which the present disclosure is directed.

(Effects and Advantages Produced by the Organic EL Element)

As described above, the hole injection layer 4 of the organic EL element 10 contains tungsten oxide. In addition, after the formation of the hole injection layer 4, a surface thereof is exposed to ultraviolet light of a predetermined wavelength. As a result, adherents on the surface of the hole injection layer 4 have been removed to a maximum, without affecting the energy level resulting from structures similar to oxygen vacancies present in tungsten oxide. This enables the organic EL element to be driven with low drive voltage and have longevity.

Also, the hole injection layer 4 has a recessed structure according to which the inner surface 4b (i.e., the inner bottom surface 4c and the inner side surface 4d) of the recessed portion 4a is in contact with the functional layer. In this way, the ink ejected into the recessed portion 4a does not easily overflow from the bank 5 into an adjacent pixel region, allowing for high-definition patterning of the functional layer.

(Manufacturing Method of the Organic EL Element)

FIGS. 9A-9D are processing drawings for explaining a method of manufacturing an organic EL element according to Embodiment 1. FIGS. 10E-10H are processing drawings for explaining the method of manufacturing the organic EL element according to Embodiment 1, which follows FIG. 9D.

Figure 9A:
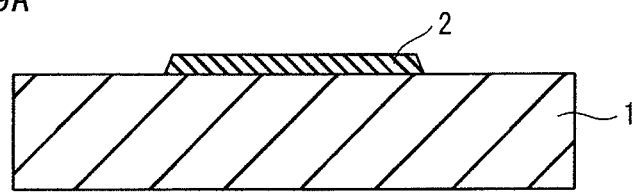
FIGS. 9A to 9D are processing drawings for explaining a method of manufacturing the organic EL element according to Embodiment 1.

In the manufacturing process of the organic EL element 10 according to Embodiment 1, first, the substrate 1 made of glass is placed inside the chamber of a sputtering film-forming apparatus. Then, as shown in FIG. 9A, a predetermined sputtering gas is introduced into the chamber to form a thin Ag film on the substrate 1 by using a reactive sputtering method, for example. Thereafter, the thin Ag film is patterned by photolithography for example to form the anode 2, together with other anodes 2, in a matrix or in line. Note that the thin Ag film may be formed by vacuum deposition or the like.

Figure 9B:
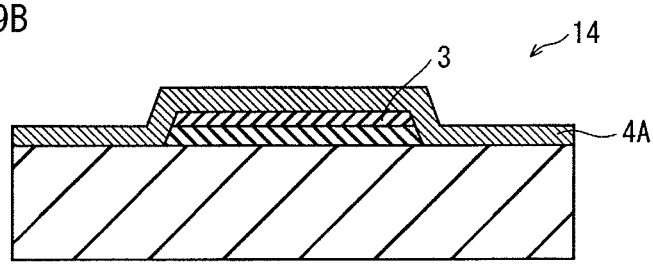

Next, as shown in FIG. 9B, a thin ITO film is formed using the reactive sputtering method or the like. The formed thin ITO film is then patterned using the photolithography or the like to form the ITO layer 3.

Following this, a thin film 4A containing tungsten oxide soluble in a predetermined solvent is formed. For example, using a compound containing tungsten oxide, the thin film 4A of tungsten oxide is formed by a vacuum deposition method or a reactive sputtering method, to be uniform all over an upper surface of the substrate 1. More specifically, after replacing the target with metal tungsten, reactive sputtering is performed. An argon gas and an oxygen gas are introduced into the chamber as the sputtering gas and the reactive gas, respectively. Under this state, high voltage is applied to ionize the argon, so that the ionized argon is caused to bombard the sputtering target. The metal tungsten ejected as a result of the sputtering phenomenon reacts with the oxygen gas, and produces tungsten oxide. As a result, the "sputtered" tungsten oxide forms the thin film 4A on the anode 2 of the substrate 1.

The film formation described above is performed under the following conditions: (i) the substrate temperature is not controlled; (ii) gas pressure (total gas pressure) is equal to 2.3 Pa; (iii) the ratio of oxygen partial pressure to the total gas pressure is equal to 50%; and (iv) input power per unit surface area of the sputtering target (input power density) is equal to 1.2 W/cm$^2$. The thin film 4A formed under the above conditions has the energy level resulting from structures similar to oxygen vacancies on its surface.

Figure 9C:
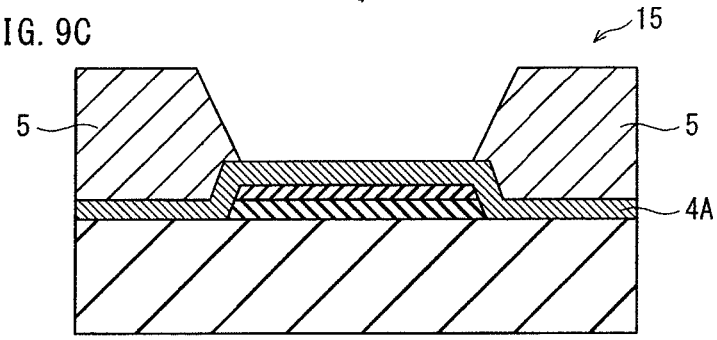

Next, as shown in FIG. 9C, the bank 5 is formed, for example, by photolithography, so as to surround each pixel region (region at which the anode 2 is positioned). In such a case, for example, a resist film (for example, resin film) including a resist material is formed on the thin film 4A by coating. Here, the resist film serves as a bank film and the resist material serves as a bank material. Subsequently, a resist pattern is formed on the resist film. After that, a desired portion of the resist film is etched by applying a developing solution and removed to form patterning of the bank 5. Note that, when the bank 5 is formed from an inorganic material, the bank is formed by a CVD method, for example. After etching, residuals of the resist film attached to a surface of the thin film 4A are removed by hydrofluoric acid, pure water, etc., for example. Furthermore, a liquid-repellent treatment is applied to the surface of the bank 5, if necessary. Note that "a resist film including a resist material" refers to "a resist film that is used as a bank film and includes a resist material as a bank material".

Figure 9D:
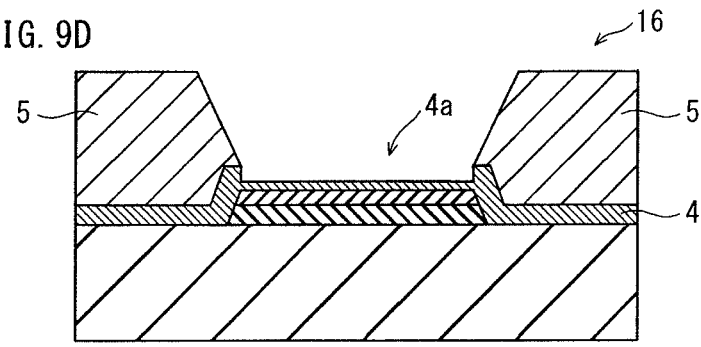

Next, as shown in FIG. 9D, the hole injection layer 4 with the recessed portion 4a is formed by using the thin film 4A. Specifically, the recessed portion 4a is formed by melting a part of the thin film 4A. Thereby, in the hole injection layer 4, the region defined by the bank 5 has a film thickness smaller than a film thickness of other regions. The recessed portion 4a is formed, for example, when an impure substance such as hydrofluoric acid remaining on the surface of the bank 5 is being cleaned with pure water after residuals of the resist film are removed, by melting the region defined by the bank 5 on an upper surface of the thin film 4A with the pure water. In such a case, the predetermined solvent is pure water, and it is possible to change a depth and shape of the recessed portion 4a by changing condition of cleaning with the pure water.

As a specific method, for example, the substrate 1 is cleaned by ejecting pure water (for example, of a room temperature) thereon, while a spin coater keeps rotating the substrate 1. After that, while the substrate 1 is kept rotating, pure water is stopped being ejected and then drained. In this case, it is possible to change the depth and the shape of the recessed portion 4a by changing a time period for ejecting the pure water. Since a melting speed of the thin film 4A also changes according to the temperature of pure water, it is also possible to adjust the depth and the shape of the recessed portion 4a by the temperature of pure water.

A method for forming the recessed portion 4a is not limited to the above. For example, after the formation of the bank 5, while the residuals of the resist film that are attached to the surface of the thin film 4A are being cleaned with a cleaning liquid such as pure water, the recessed portion 4a may be formed by melting a part of the thin film 4A by the cleaning liquid at the same time. In such a case, the predetermined solvent is the cleaning liquid. Alternatively, while the resist film is being etched by the developing solution to form the bank 5 and the residuals of the resist film that are attached to the thin film 4A are being cleaned by the developing solution, the recessed portion 4a may be formed by melting the part of the thin film 4A at the same time. In such a case, the predetermined solvent is the developing solution.

When the hole injection layer 4 is formed by dissolving the thin film 4A with use of a solvent such as a cleaning liquid and a developing solution that are used in forming the bank 5, productive efficiency is high since a different predetermined solvent to form the recessed portion 4a is not required and an additional process to form the recessed portion 4a is also not required.

Note that the recessed portion 4a is not limited to be formed by using the predetermined solvent. Another method like the following may be used. For example, first, a thin film made of tungsten oxide is formed with use of spattering and photolithography at all the areas except an area at which the anode 2 is located. After that, on the thin film, another thin film made of tungsten oxide is formed to cover all the areas and the hole injection layer 4 having the recessed portion is formed at the area at which the anode 2 is located.

Next, as shown in FIG. 10E, the light-emitting layer 6 is formed by: ejecting drops of an ink composition including an organic light-emitting material by, for example, the ink-jet method in the region defined by the bank 5; coating the ink along the inner bottom surface 4c and the inner side surface 4d of the recessed portion 4a of the hole injection layer 4; removing the solvent by volatilization; and drying the ink.

In the case where the buffer layer 13 is formed between the hole injection layer 4 and the light-emitting layer 6, the buffer layer 13 is formed in a similar manner as described above, before the light-emitting layer 6 is formed. That is, the buffer layer 13 is formed by ejecting drops of an ink composition including an organic amine-containing molecular material, and removing the solvent by volatilization. The buffer layer 13 and the light-emitting layer 6 may be formed by a wet process other than the inkjet method. For example, the buffer layer 13 and the light-emitting layer 6 may be formed by dripping and applying ink according to a method such as a dispenser method, a nozzle coating method, a spin coat method, a intaglio printing method, or a letterpress printing method.

Next, as shown in FIG. 10F, a thin barium film as the electron injection layer 7 is formed using a vacuum deposition method or the like. Then, as shown in FIG. 10G, a thin aluminum film as the cathode 8 is formed using a vacuum deposition method, and as shown in FIG. 10H, the passivation layer 9 is further formed.

In the above process, an intermediate product is obtained after the formation of the thin film 4A. This intermediate product is taken out of the chamber to be exposed to the atmosphere. As a result, gas molecules and the like are adhered to the surface of the thin film 4A, and to the surface (including the inner surface 4b of the recessed portion 4a) of the hole injection layer 4 formed from the thin film 4A. Also, impurity molecules and the like are also adhered onto the surfaces of the layers inside the chamber.

Accordingly, an intermediate product obtained after the formation of the thin film 4A and before the formation of the functional layer (the light-emitting layer 6 or the buffer layer 13 in Embodiment 1) is irradiated with ultraviolet light in the atmosphere so as to remove adherents from the surfaces of the thin film 4A and the hole injection layer 4. For example, irradiation of ultraviolet light is performed with respect to the surface of the thin film 4A of an intermediate product 14 shown in FIG. 9B, the surface of the thin film 4A of an intermediate product 15 shown in FIG. 9C, and/or the surface of the hole injection layer 4 of an intermediate product 16 shown in FIG. 9D.

Suppose that the thin film 4A is exposed to the atmosphere after the aforementioned steps shown in FIGS. 9B and 9C. In this case, the surface of the thin film 4A in FIGS. 9B and 9C is irradiated with ultraviolet light, whereby the gas molecules and impurities adhered to the surface of the thin film 4A can be removed at as early a stage as possible. Also, in the step shown in FIG. 9D, which is a step subsequent to the steps shown in FIGS. 9B and 9C, gas molecules and impurities adhered to the surface of the thin film 4A may be removed together with part of the thin film 4A that is lost as a result of reduction in the thickness of the thin film. The effectiveness in the removal of adherents depends on the relationship between the thinning amount of the thin film 4A and the depth of adherents absorbed in the thin film 4A. For example, if the film thinning amount is sufficiently larger than the depth of adherents absorbed in the thin film 4A, most of the adherents can be removed. As a result, irradiation with ultraviolet light is less likely to be required with respect to the thin film 4A exposed to the atmosphere after the steps shown in FIGS. 9B and 9C. If the film thinning amount is smaller than the depth of adherents absorbed in the thin film 4A, the adherents may remain on the thin film 4A. Accordingly, it is desirable that irradiation with ultraviolet light is performed on the thin film 4A exposed to the atmosphere after the steps of FIGS. 9B and 9C.

Suppose that the thin film 4A is exposed to the atmosphere after the step shown in FIG. 9D. In this case, irradiation of ultraviolet light with respect to the thin film 4A can produce a synergistic effect, whereby molecules adhered to the surface of the thin film 4A is removed together with residuals of the bank 5 attached to the surface of the thin film 4A.

Note that irradiation with ultraviolet light may be performed on any one or more of the intermediate products 14, 15, and 16.

For example, as shown in FIG. 11, irradiation with ultraviolet light is performed on the surface of the thin film 4A of the intermediate product 14 shown in FIG. 9B, with use of an ultraviolet (UV) irradiation apparatus 20 having a metal halide lamp manufactured by Ushio Inc. (Model No.: UVL-3000M2-N) as a light source 21. The irradiation conditions are separately deter mined by experiments conducted using photoemission spectroscopy measurements, which will be described later. Specifically, the irradiation conditions are determined so that changes in shape of the resulting photoelectron spectrum in a spectral region corresponding to a predetermined binding energy range converge. In this embodiment, the irradiation intensity is determined to be 155 mW/cm$^2$ and the irradiation duration is determined to be 10 minutes. The UV irradiation apparatus 20 will be described later in detail.

(Effects Achieved by Manufacturing Method of Organic EL Element)

The above-described manufacturing method of the organic EL element 10 involves a UV irradiation step of radiating ultraviolet light having the predetermined wavelength, performed after the hole injection layer 4 of tungsten oxide is formed. With the step, adherents on the surface of the hole injection layer 4 are removed, while the energy level resulting from structures similar to oxygen vacancies of tungsten oxide is maintained on the hole injection layer surface.

Furthermore, the energy level mentioned above is continuously maintained in the atmosphere throughout the time from the cleaning of the hole injection layer 4 to the formation of the buffer layer. Consequently, the ability of hole injection is maintained with stability. This ensures the stable manufacturing of the organic EL element 10 that is driven with low drive voltage and has longevity.

Furthermore, the duration of UV irradiation and the intensity of ultraviolet light in the UV irradiation step are determined in view of the conditions with which, with respect to a photoelectron spectrum exhibited by the hole injection layer 4, changes in shape of a spectral region corresponding to a predetermined binding energy range converge. That is, the irradiation conditions are determined to achieve the maximum removable of adherents with the minimum conditions. Thus, the highly stable hole injection efficiency is realized with a minimum cleaning process.

<UV Irradiation Apparatus>

The following describes the UV irradiation apparatus 20. The UV irradiation apparatus 20 as shown in FIG. 11 is for radiating ultraviolet light to the intermediate product 14 of the organic EL element 10 and includes: a light source 21 that emits ultraviolet light mainly within the wavelength region longer than 184.9 nm and equal to 380 nm or shorter; a reflector 22 that reflects ultraviolet light emitted by the light source 21 toward the intermediate product 14; a housing 23 that houses the light source 21 and the reflector 22 to hold them in place; and a control unit 24 that controls ON/OFF of the light source 21.

The intermediate product 14 has, for example, the anode 2 and the thin film 4A composed of tungsten oxide layered on the substrate 1, but does not have the light-emitting layer 6, which is to be formed later.

The light source 21 is, for example, a straight metal halide lamp disposed to longitudinally coincide with the widthwise direction of the intermediate product 14 being transferred. The light source 21 is operated to emit light under the conditions suitable for effective manufacturing of organic EL elements capable of emitting light at high intensity and low electrical consumption. The conditions of UV irradiation, such as irradiation duration and irradiation intensity, are deter mined based on various factors, including the formation conditions of the thin film 4A and the convergence of changes in shape of photoelectron spectroscopy spectra exhibited by the thin film 4A as described in the present embodiment. The irradiation conditions are set by an operator. Alternatively, the irradiation conditions may be automatically set by the control unit 24. For example, the control unit 24 stores a database in which layer forming conditions, irradiation durations, and irradiation intensities are correlated. On receiving input of the layer forming conditions by the operator, the control unit 24 sets the irradiation duration and intensity with reference to the database.

The intermediate product 14 is transported to the position for UV irradiation by a conveyer 25. In the figure, the intermediate product 14 placed onto the conveyer 25 from the upstream (right-hand side of the figure) in the transport direction is transported by the conveyer 25 to pass the position for receiving UV irradiation. While the intermediate product 14 is passing the position, a predetermined amount of ultraviolet light is applied to the upper surface of the intermediate product 14, i.e., the upper surface of the thin film 4A. Having been irradiated with ultraviolet light, the intermediate product 14 is transported out to the downstream (left-hand side of the figure).

In the UV irradiation apparatus 20 described above, the light source 21 is not limited to a metal halide lamp. Alternately, the light source 21 may be any light source capable of emitting ultraviolet light mainly within the wavelength region longer than 184.9 nm and equal to 380 nm or shorter (desirably, longer than 253.7 nm and equal to 380 nm or shorter).

<Observations and Experiments>

With the aim of preventing increase in drive voltage of the organic EL element and reduction in longevity of the organic EL element, the present inventors have come to a technical idea of adding, to the manufacturing process, a cleaning step of removing adherents from the layer surfaces subsequently to the formation of the respective layers.

As the cleaning methods for removing adherents, the present inventors have turned their attention to ultraviolet (UV) ozone cleaning and oxygen plasma cleaning, which are widely used for cleaning glass substrates and electrodes, for the high degree of cleanliness achieved thereby. Intensive studies by the present inventors on the cleaning methods have revealed that neither UV ozone cleaning nor oxygen plasma cleaning is suitable for cleaning the hole injection layer of an organic EL element, provided that the hole injection layer includes tungsten oxide.

The reason is as follows. Both the UV ozone cleaning and oxygen plasma cleaning utilize strong oxidation associated with oxygen radicals formed by decomposition of oxygen molecules. Through the oxidation, oxygen atoms end up filling structures similar to oxygen vacancies of tungsten oxide on the surface of the hole injection layer. Consequently, the energy level resulting from structures similar to oxygen vacancies disappears from the hole injection layer including tungsten oxide. As a result, there is a risk of decreasing the hole injection efficiency. To be more precise, the present inventors have confirmed, by experiments described below, that the energy level resulting from structures similar to oxygen vacancies almost completely disappear through UV ozone cleaning.

Based on the above findings, the present inventors have recognized the importance of the following two points in order to prevent increase in the drive voltage of, and decrease in the longevity of an organic EL element having a hole injection layer including tungsten oxide. One of the points is that the energy level resulting from structures similar to oxygen vacancies of tungsten oxide on the surface of the hole injection layer remains without being eliminated. The other of the points is that adherents are removed from the surface the hole injection layer.

After a series of researches and studies regarding the above features of the present disclosure, the present inventors came to be aware of Non-Patent Literature 1 disclosing UV ozone cleaning performed subsequently to the formation of a hole injection layer including tungsten oxide. However, Non-Patent Literature 1 discloses nothing about the impact on the characteristics of the organic EL element imposed by UV ozone cleaning and nothing about optimizing the conditions of UV ozone cleaning. It is further noted that Non-Patent Literature 1 does not describe anything about the fact, which are found by the present inventors through specific studies, that UV ozone cleaning is not suitable for cleaning a hole injection layer including tungsten oxide unless adequately modified. Naturally, Non-Patent Literature 1 does not describe anything about the technical reasons for the unsuitability.

As another method for removing adherents, the following discusses sputter etching of performing argon ion sputtering in a vacuum chamber subsequently to the formation of the hole injection layer. The sputter etching has been reported to remove adherents and also to increase the energy level resulting from structures similar to oxygen vacancies. Thus, the sputter etching appears to be an excellent cleaning method at first.

Unfortunately, the clean surface and the increased energy level obtained by the sputter etching can be maintained only in the vacuum chamber for the following reason. That is, the surface of a hole injection layer treated by sputter etching in vacuum is highly instable because the molecular bonds have been forcedly broken by an ion beam. Therefore, once taken out of the vacuum chamber, the hole injection layer easily adsorbs atmospheric molecules to be stabilized. In the manner described above, structures similar to oxygen vacancies of tungsten oxide which are created in vacuum are instantly filled, and the layer surface once cleaned rapidly adsorbs contaminants.

The layer surface may be kept clean by performing some or all of the subsequent manufacturing steps continuously inside the vacuum chamber. However, performing manufacturing steps inside a vacuum chamber is applicable, on condition that the organic EL panel to be manufactured is relatively small. For a large-sized organic EL panel having display size of e.g., around 50 inches, it is extremely difficult to perform the manufacturing steps inside a vacuum chamber as the vacuum chamber needs to be large enough for such a large-sized organic EL panel. Besides, the throughput of steps performed inside a vacuum chamber is small, and such steps are not desirable for mass production.

As an alternative to removing adherents, a method of preventing adhesion of contaminants per se is one possibility. For example, by performing some or all of manufacturing steps subsequent to the layer formation continuously inside a vacuum chamber, the respective layers are exposed neither to the atmosphere nor to impurity molecules. Thus, the layer surfaces are kept free or substantially free of contaminants. However, this scheme is extremely difficult to apply to the manufacturing of large-sized organic EL panels because the vacuum chamber of a corresponding size is required as already described above.

Alternatively, performing manufacturing steps inside a chamber filled with inert gas is another possibility. This scheme is applicable to the manufacturing of large-sized organic EL panels. Unfortunately, such a chamber still contains impurity molecules and the like, although the amount is smaller than that in the atmosphere. In addition, complete removal of such molecules from the chamber is difficult.

As has been described above, it is extremely difficult to obtain an organic EL element having a hole injection layer satisfying that (i) the energy level resulting from structures similar to oxygen vacancies of tungsten oxide on the layer surface remains without being eliminated and (ii) the surface of the hole injection layer is free or substantially free of adherents.

In contrast, an organic EL element according to one aspect of the present disclosure includes a hole injection layer satisfying that on the surface thereof, an energy level resulting from structures similar to oxygen vacancies of tungsten oxide remains without being eliminated. Therefore, holes are injected from the anode to the functional layer with efficiency. Consequently, the organic EL element emits light at low power consumption and high intensity. In addition, since adherents have been removed from the surface of the hole injection layer, no or substantially no contaminants are embedded between the hole injection layer and the functional layer. As a consequence, the drive voltage of the organic EL element is not increased and no carrier traps, such as impurities derived from adherents, are formed, which ensures a long life and favorable characteristics of the organic EL element.

(1) Effect of Adherents Removal by UV Irradiation

According to this embodiment, subsequently to its formation, the hole injection layer 4 composed of tungsten oxide is exposed to ultraviolet light under the predetermined conditions, whereby adherents are removed from the surface of the hole injection layer 4. The adherent removal effect achieved by the UV irradiation is confirmed by the following experiments.

By the manufacturing method according to the present embodiment, samples were prepared each by laminating the anode 2 composed of ITO on the substrate 1, and the hole injection layer 4 composed of tungsten oxide on the anode 2, in the chamber of the sputtering film-forming apparatus. After the lamination, each intermediate sample was taken out of the chamber to the atmosphere to prepare samples without any UV irradiation, samples with UV irradiation for one minute, and samples with UV irradiation for ten minutes. The irradiation intensity was 155 mW/cm$^2$.

In the following description in the present embodiment, a sample without UV irradiation may be referred to as a "no-irradiation sample" and a sample with UV irradiation for n minutes may be referred to as an "n-minute irradiation sample".

Each sample was then attached to a photoelectron spectroscopy apparatus (PHI 5000 VersaProbe) manufactured by ULVAC-PHI, Incorporated to measure the X-ray photoelectron spectroscopy (XPS). Generally, an XPS spectrum indicates the elemental composition, binding condition, and valence of the target surface up to several nanometers in depth. That is, if elements not originally contained in tungsten oxide are observed, it is highly likely that the elements are adherents. In addition, it is generally known that molecules adhere as a result of atmospheric exposure or during a manufacturing process are mainly carbon-containing molecules, if water molecules and oxygen molecules are excluded. Therefore, the adherents removal effect achieved is confirmed by measuring changes in the carbon concentration in the surface region of the hole injection layer 4.

The conditions under which the XPS measurement was conducted are as follows. Note that no charge-up occurred during the measurement.

Light source: Al Kα
Bias: None
Electron emission angle: Normal line direction of the substrate surface First, each sample was subjected to wide-scan measurement. As a result of the measurement, the only elements found in each sample were tungsten (W), oxygen (O), and carbon (C). Then, narrow-scan spectra of each sample were measured for the W 4f orbital (W4f) and also for the C1s orbital (C1s) to obtain the relative value of the number density of carbon atoms to the number density of tungsten atoms present in the surface region up to several nanometers in depth of the hole injection layer 4 composed of tungsten oxide. That is, the composition ratio between W and C was obtained. The composition ratio was obtained from the spectra, by using the composition ratio calculation function of "MultiPak" XPS, which is analyzing software included with the photoelectron spectroscopy apparatus used in the measurements.

Table 1 below shows the composition ratio between W and C of each sample.

TABLE 1

| Sample Name | Composition Ratio between W and C (W:C) |
|---|---|
| No-Irradiation Samples | 1:1.27 |
| 1-Minute Irradiation Samples | 1:0.83 |
| 10-Minute Irradiation Samples | 1:0.62 |

With reference to Table 1, the number of carbon atoms relative to the number of tungsten atoms decrease more and more as the irradiation duration is longer, which is apparent when comparing the samples without irradiation against the samples with 1-minute irradiation and the samples with 10-minute irradiation. That is, it is made clear that the UV irradiation according to the present embodiment serves to decrease adherents on the surface of the hole injection layer 4 composed of tungsten oxide.

(Influences of UV Irradiation on Hole Injection Ability)

According to the present embodiment, the UV irradiation is performed to remove adherents from the surface of the hole injection layer 4 composed of tungsten oxide, in a manner that the energy level resulting from structures similar to oxygen vacancies is maintained without any substantial influence. Note that the structures similar to oxygen vacancies favorably affect the hole injection ability. This property of maintaining structures similar to oxygen vacancies is confirmed by the following experiments.

In the experiments, the above-described samples without irradiation, with 1-minute irradiation, and with 10-minute irradiation were subjected to UPS (ultraviolet photoelectron spectroscopy) measurements. Generally, a UPS spectrum indicates the electronic state, from the valence band to the Fermi surface (Fermi level), of the measurement target surface of up to several nanometers in depth. Especially in the case where the measurement target is tungsten oxide or molybdenum oxide, the presence of structures similar to oxygen vacancies on the layer surface is indicated by a protrusion appearing, in a UPS spectrum, near the Fermi surface in the low binding energy direction from the top of the valence band (hereinafter, such a protrusion is referred to as a "spectral protrusion near the Fermi surface") (Non-Patent Literature 2 and 3). That is, by observing changes in the spectral protrusion near the Fermi surface before and after UV irradiation, the influence imposed by the UV irradiation on the structures similar to oxygen vacancies on the layer surface is examined. In tungsten oxide, the spectral protrusion near the Fermi surface occupies a binding energy range that is from 1.8 eV to 3.6 eV lower than the top of the valence band (the lowest binding energy within the valence band).

The conditions under which the UPS measurement was conducted are as follows. Note that no charge-up occurred during the measurement.

Figure 12:
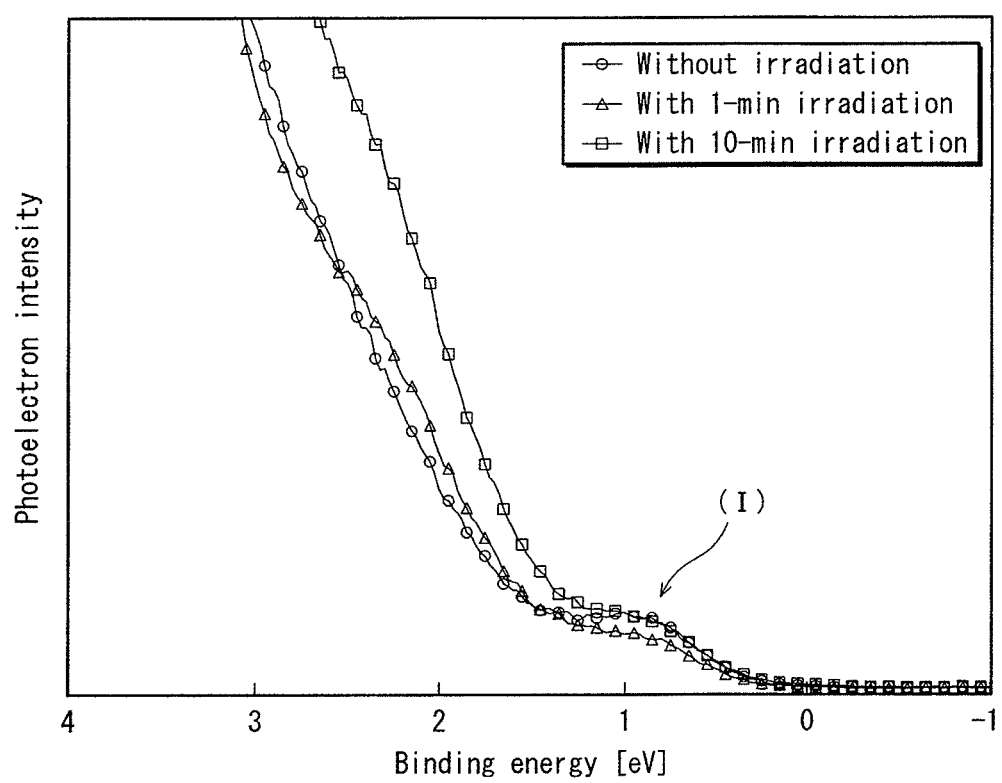
FIG. 12 illustrates a UPS spectrum of tungsten oxide.

Light source: He I
Bias: None
Electron emission angle: Normal line direction of the substrate surface FIG. 12 shows the UPS spectra of the respective samples, focusing on portions near the Fermi surface. In the following description, every photoelectron spectroscopy spectrum (UPS and XPS) is shown with the horizontal axis representing the binding energy having the origin point in the Fermi surface and with the left direction relative to the origin point being positive. In all the spectra measured on the samples without irradiation, with 1-minute irradiation, and with 10-minute irradiation, a spectral protrusion near the Fermi surface is clearly observed. In the figure, spectral protrusions near the Fermi surface are collectively denoted by (I). These results indicate that the structures similar to oxygen vacancies favorably affecting the hole-injection ability are maintained even after the UV irradiation.

For the purpose of comparison, UV ozone cleaning was also performed. More specifically, samples were prepared each by laminating the anode 2 composed of ITO on the substrate 1, and the hole injection layer 4 composed of tungsten oxide on the anode 4, in the chamber of a sputtering film-forming apparatus. The intermediate samples were then taken out of the chamber to the atmosphere, followed by UV ozone cleaning of the surface of the hole injection layer 4 by a UV ozone apparatus. The samples after the UV ozone cleaning were subjected to UPS measurement to check the presence of a spectral protrusion near the Fermi surface.

Figure 13:
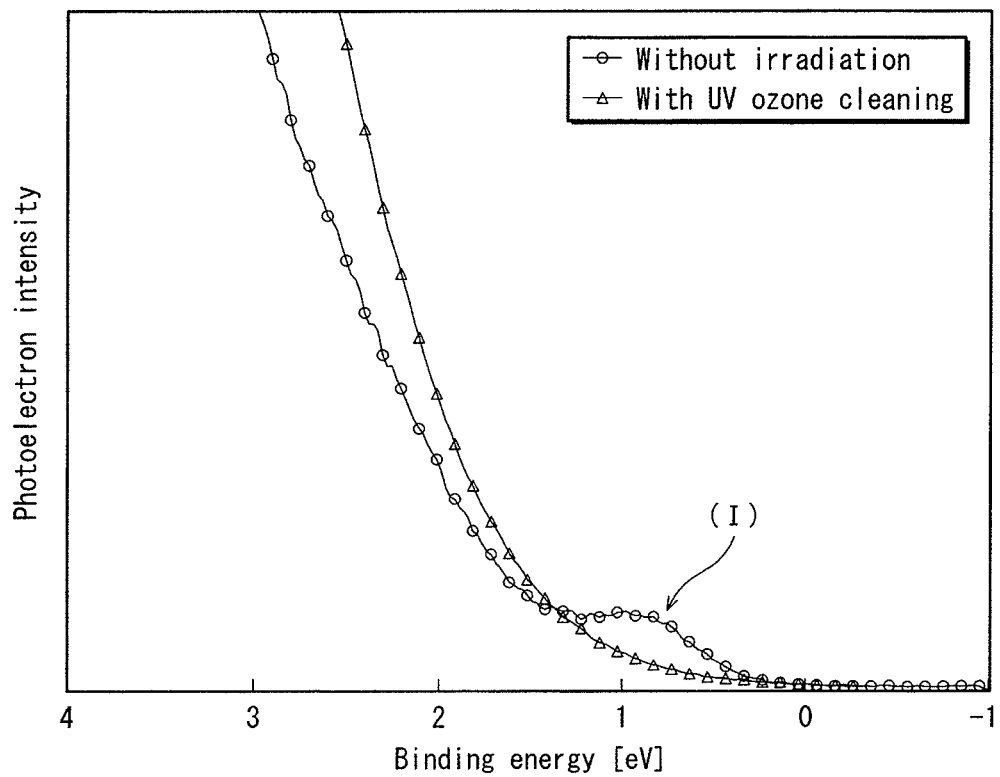
FIG. 13 illustrates UPS spectra of tungsten oxide.

FIG. 13 illustrates the UPS spectrum measured on the hole injection layer 4 composed of tungsten oxide having been subjected to the UV ozone cleaning for three minutes, focusing on a portion near the Fermi surface. For the purpose of comparison, FIG. 13 also illustrates the UPS spectrum of the samples without irradiation, which is illustrated in FIG. 12. Unlike the results shown in FIG. 12 regarding the samples subjected to the UV irradiation according to the present embodiment, no spectral protrusion near the Fermi surface is observed at all. The results indicate that through the UV ozone cleaning, almost all structures similar to oxygen vacancies are lost from the surface of the hole injection layer 4.

As described above, it is clarified that cleaning by the UV irradiation according to the present embodiment is different from the UV ozone cleaning in that structures similar to oxygen vacancies are maintained without being lost. That is, structures similar to oxygen vacancies, which favorably affect the hole injection ability, are not eliminated by the UV irradiation.

(2) Regarding Method for Determining UV Irradiation Conditions

According to the present embodiment, the surface of the hole injection layer 4 composed of tungsten oxide is cleaned by UV irradiation. It is confirmed by the following experimental results that the adherent removal effect becomes saturated with the irradiation for a specific duration or longer.

Figure 14:
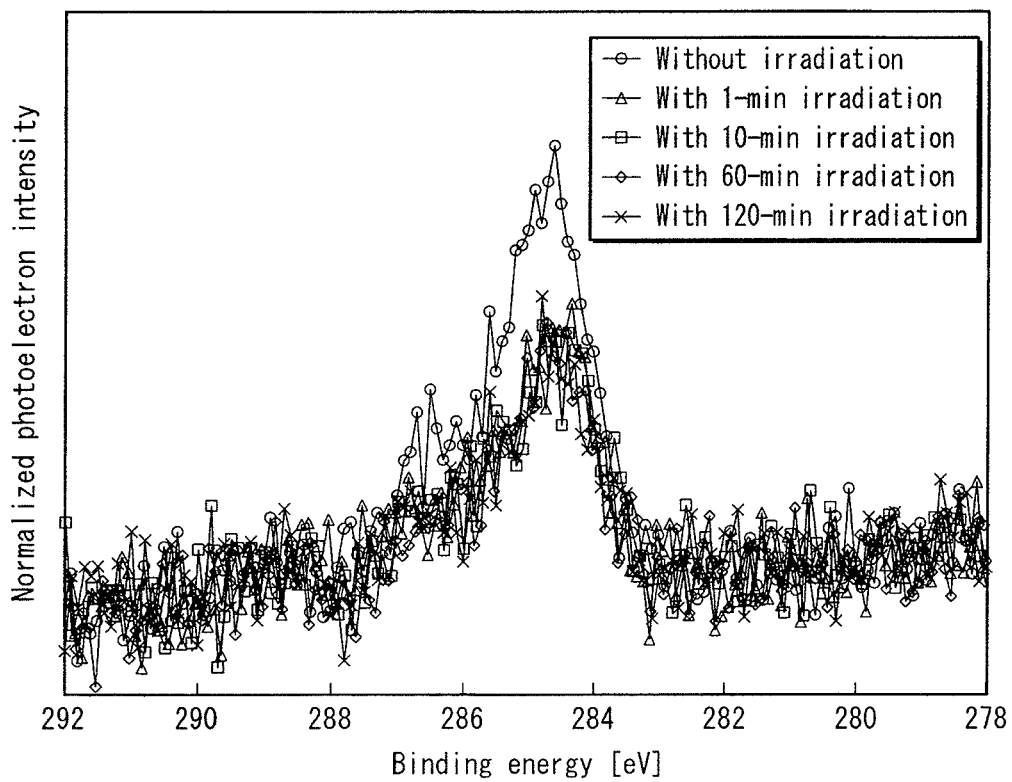
FIG. 14 illustrates XPS spectra of tungsten oxide.

In the same manner as described above, samples without irradiation, with 1-minute irradiation, and with 10-minute irradiation were prepared. In addition, samples with 60-minute irradiation and 120 minute irradiation were prepared. Then, narrow-scan spectra for W4f and C1s of the respective samples were measured by XPS measurement. From the respective spectra, background components are subtracted. Then, the photoelectron intensity is normalized using the area intensity of the narrow-scan spectrum for W4f. The narrow-scan spectra for C1s of the respective samples are shown in FIG. 14. The area intensity of each C1s spectrum illustrated in FIG. 14 is proportional to the ratio of the number density of carbon atoms to the number density of tungsten atoms, all of which were present in the surface region of the hole injection layer 4 composed of tungsten oxide up to several nanometers in depth from the layer surface.

According to FIG. 14, the C1s spectra measured on the samples with 1-minute irradiation or longer are all substantially equal in intensity. This indicates that the adherent removal effect has substantially reached a level of saturation with the irradiation for the duration of one minute or longer.

Generally, a C1s spectrum tends to be low in intensity and roughly irregular as shown in FIG. 14, because the amount of adherents is intrinsically small. Therefore, C1s spectra may not serve the best in determining saturation of the adherent removal effect. In view of this, the following describes other methods involving the use of spectra of relatively strong intensity, for determining saturation of the adherent removal effect.

The first of such a method is to make a saturation determination based on changes in the shape of a UPS spectral region corresponding to a range of binding energy around the top of the valence band (i.e., the UPS spectral region corresponding to the binding energy range from 4.5 eV to 5.4 eV). A peak or shoulder appearing in the spectral region indicates a lone pair of electrons in the 2p orbital in oxygen atoms included in tungsten oxide.

Figure 15:
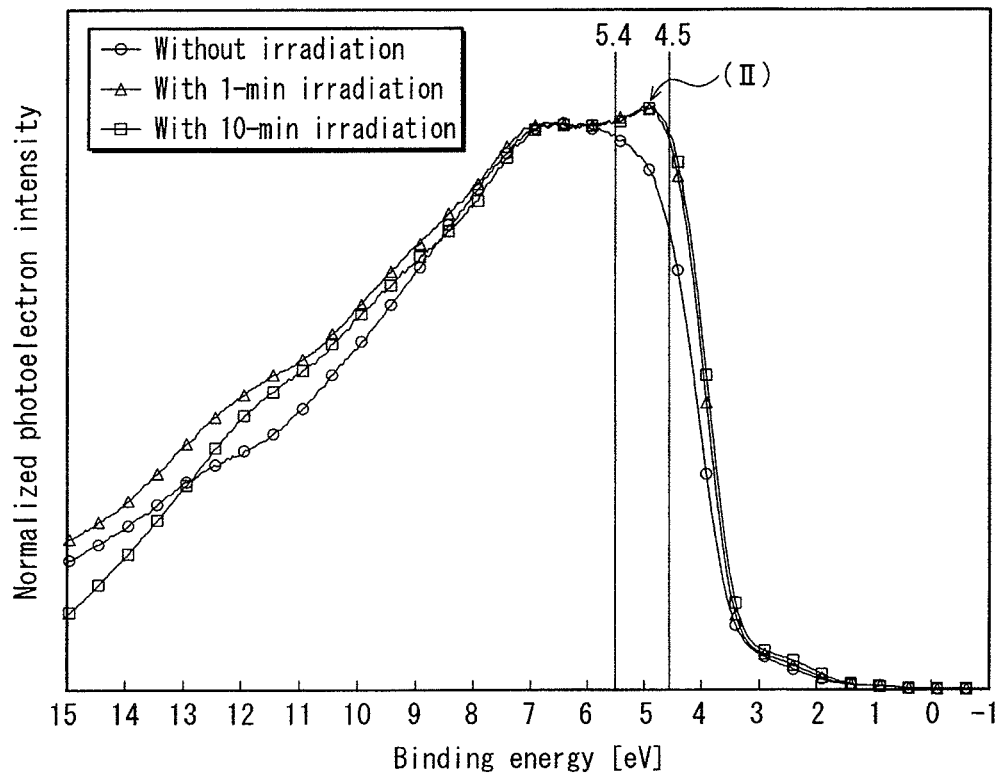
FIG. 15 illustrates a UPS spectrum of tungsten oxide.

FIG. 15 illustrates the UPS spectra. The UPS measurements were made on the respective samples without irradiation, with 1-minute irradiation, and with 10-minute irradiation. The photoelectron intensity is normalized using a gentle peak appearing around the binding energy of 6.5 eV. As shown in FIG. 15, the spectra measured on samples with 1-minute irradiation and with 10-minute irradiation both have a clear peak (denoted by (II) in the figure) appearing in the binding energy range from 4.5 eV to 5.4 eV. Such a peak does not appear in the spectrum measured on samples without irradiation. In addition, the respective spectra measured on samples with 1-minute irradiation and with 10-minute irradiation are substantially identical in the shape of the peak. This means that changes in the UPS spectral shape within the binding energy range from 4.5 eV to 5.4 eV substantially converge with the irradiation for the duration of one minute or longer. This behavior is similar to that observed in C1s spectra. In addition, this behavior is assumed to indicate, similarly to C1s spectra, that the adherent removal effect is obtained by UV irradiation and that the effect becomes saturated with the irradiation performed for the duration of one minute or longer.

Figure 16:
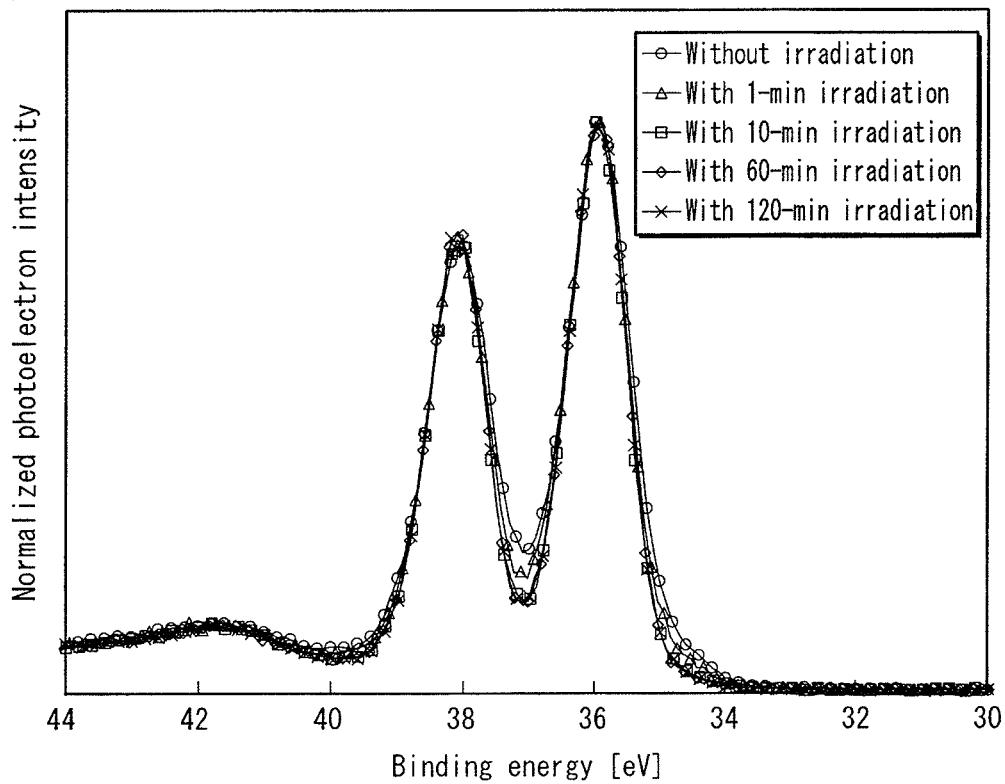
FIG. 16 illustrates XPS spectra of tungsten oxide.

The second one of such a method uses XPS measurements to make a saturation determination based on changes in the W4f spectral shape. FIG. 16 shows W4f spectra measured on the respective samples without irradiation, with 1-minute irradiation, with 10-minute irradiation, with 60-minute irradiation, and with 120-minute irradiation. The spectra are normalized using the maximum and minimum values.

As shown in FIG. 16, all the samples with irradiation exhibit a peak steeper than a peak exhibited by the samples without irradiation (i.e., the half-width of each peak is smaller). It is noted, in addition, that the peak shape is slightly steeper for the samples with 10-minute irradiation than for the samples with 1-minute irradiation. Yet, for the samples with 10-minute irradiation, with 60-minute irradiation, and with 120-minute irradiation, the spectra coincide substantially entirely. This means that changes in the spectral shape converge for any samples with irradiation performed for the duration of ten minutes or longer.

Such changes in shape of W4f spectra resulting from different irradiation durations are explained in the following way, for example. Although it depends on the configuration of adherents, provided that the adherents supply negative charges to tungsten atoms present on the layer surface, the binding energy of the inner-shell orbital W4f becomes lower according to the negative charges. Chemically speaking, some of hexavalent tungsten atoms present on the layer surface of tungsten oxide change into lower-valent atoms, such as pentavalent atoms. In the XPS spectrum for W4f, this energy level shift is observed as a broader spectral shape because of the spectrum for hexavalent tungsten atoms, which make up the majority, overlapping with the spectrum for lower-valent tungsten atoms, which make up a small proportion.

In view of the above, with respect to the spectra illustrated in FIG. 16, it is assumed that the peak is sharper in shape because the removal of adherents by the UV irradiation alters pentavalent tungsten atoms back into hexavalent atoms. From the above observation, it is understood that most of the adherents are removed by the UV irradiation performed for one minute and that the adherent removal effect has reached a level of saturation with the UV irradiation performed for ten minutes or longer. This behavior is similar to that observed on C1s.

In addition, although not illustrated in the figure, it is confirmed that the changes in the shape of the spectra for O1s orbital of oxygen atoms converge with the UV irradiation performed for ten minutes or longer.

From the above, the adherent removal effect achieved by the UV irradiation according to the present embodiment becomes saturated with the UV irradiation performed for a certain duration or longer. Here, the irradiation conditions can be determined as follows. For example, the irradiation duration is determined by measuring, with respect to any specific irradiation intensity, the time taken for changes in the shape of the narrow-scan spectrum for W4f or O1s in XPS measurement to converge or changes in the shape of UPS spectral region corresponding to the binding energy range from 4.5 eV to 5.4 eV to converge. The time thus measured is determined to be the irradiation duration. More specifically, a spectrum measured after the UV irradiation for n minutes is compared with a spectrum measured after the UV irradiation for (n+1) minutes to obtain the difference between the two spectra at each of a plurality of measurement points. If the root-mean-square of the differences in the normalized intensity becomes equal to a specific value or smaller, it is then determined that the changes in the spectral shape converge with the irradiation duration of n minutes and thus the maximum level of adherent removal has been completed. In this embodiment, it is determined from FIGS. 15 and 16 that the adherent removal effect becomes saturated with the UV irradiation performed for ten minutes.

(3) Regarding Maintaining Electronic State after UV Irradiation

According to the present embodiment, the energy level resulting from structures similar to oxygen vacancies, which favorably affect the hole-injection ability, is maintained at least throughout the time from the surface cleaning and until another layer is formed on the cleaned surface. The grounds are as follows.

The UPS spectra shown in FIG. 12 described above were measured two days after the UV irradiation. That is, between the samples without irradiation and the samples with the respective irradiation durations that were left to stand in the atmosphere for two days after the UV irradiation, there is no notable difference in the spectral protrusion near the Fermi surface of the UPS spectra. In each UPS spectrum, the spectral protrusion is clearly observed. In addition, although not illustrated in the figures, measurements were made on samples two hours after the UV irradiation and one day after the UV irradiation. In these measurements, the spectral protrusion near the Fermi surface was clearly observed in each spectrum in a manner similar to FIG. 12. That is to say, it is confirmed that the energy level resulting from structures similar to oxygen vacancies are sustained in the atmosphere at least for two days after the UV irradiation.

This time period of two days is sufficiently long as compared with the time that normally lapses after the step of cleaning the hole injection layer 4 by UV irradiation before the completion of the step of laminating the buffer layer 13 on the hole injection layer 4. That is, unless the step of forming the buffer layer 13 is intentionally delayed, it is unlikely that the buffer layer 13 is not formed until after this two-day period.

(4) Regarding Improvements on EL Element Characteristics by UV Irradiation

The organic EL element 10 according to the present embodiment manufactured using the step of cleaning the hole injection layer 4 by UV irradiation exhibits better characteristics as compared with an organic EL element manufactured without UV irradiation. Such characteristics are confirmed by the following experiments.

First, the inventors prepared hole-only devices as assessment devices to be used in accurately determining the effect on the hole injection efficiency from the hole injection layer 4 to the buffer layer 13 achieved by removing adherents from the surface of the hole injection layer 4 by UV irradiation.

Generally, in an organic EL element, electric current is formed of carriers, which consists of holes and electrons. As such, the electrical characteristics of an organic EL element reflects electron current as well as hole current. However, since, in a hole-only device, the injection of electrons from the cathode is blocked, there is almost no flow of electron current. Thus, electrical current flowing in a hole-only device consists almost entirely of hole current. In other words, it could be considered that only holes function as a carrier in a hole-only device. Thus, a hole-only device is ideal in making an assessment of hole injection efficiency.

Figure 17:
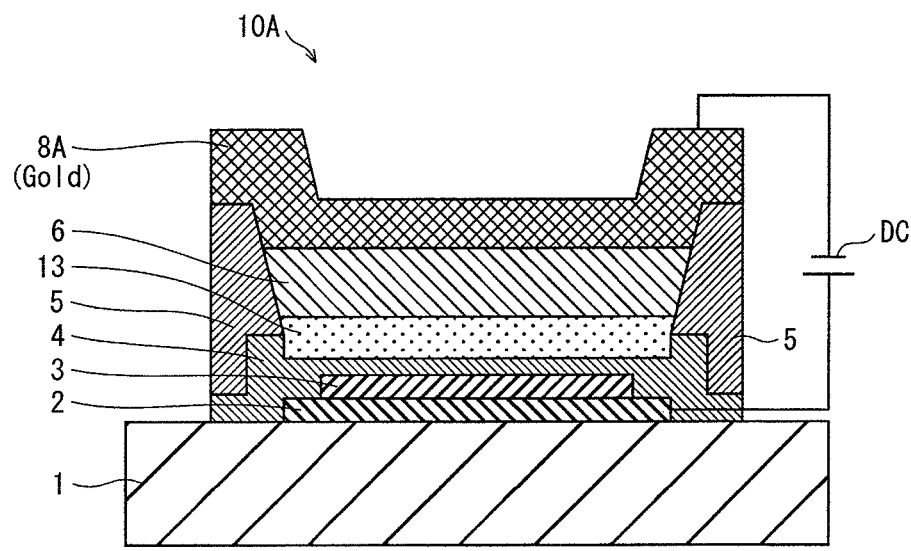
FIG. 17 is a schematic cross-sectional view illustrating a structure of a hole-only device.

In detail, hole-only devices 10A prepared were actually obtained by replacing the cathode 8 of the organic EL element 10 illustrated in FIG. 8 with gold (Au) to form a cathode 8A as illustrated in FIG. 17. Specifically, by following the manufacturing method of the organic EL element 10 according to the present embodiment, a 50 nm-thick thin ITO film is formed as the anode 2 on the substrate 1 by a sputtering method, as illustrated in FIG. 17. Then, a 30 nm-thick tungsten oxide layer is formed as the hole injection layer 4 on the anode 2, by a predetermined sputtering method in a manner that the layer surface has the energy level resulting from structures similar to oxygen vacancies. Then, a 20 nm-thick layer of TFB, which is an amine-containing organic polymer, is formed as the buffer layer 13 on the hole injection layer 4, and a 70 nm-thick layer of F8BT, which is an organic polymer, is formed as the light-emitting layer 6. Finally, a 100 nm-thick layer of gold is formed as the cathode 8A on the light-emitting layer 6.

Note that two hole-only devices 10A were prepared. One of the hole-only devices 10A had the hole injection layer 4 exposed to the UV light according to the present embodiment (for the irradiation duration of 10 minutes) after the hole injection layer 4 was formed and taken out of the chamber of the sputtering film-forming apparatus. The other of the hole-only devices 10A had the hole injection layer 4 not exposed to UV light. Hereinafter, the former hole-only device 10A is referred to as "HOD with irradiation", whereas the latter hole-only device 10A is referred to as "HOD without irradiation".

Each of the hole-only devices 10A thus prepared was then connected to the DC voltage source, so that voltage was applied thereto. Further, the voltage applied to each sample was changed to measure the values of electric current flowing at different voltages. Each current value is then converted into a value per unit area (current density). Note that hereinafter, the "driving voltage" refers to a voltage applied to obtain a current density value of 0.4 mA/cm$^2$.

The hole injection efficiency of the hole injection layer 4 is said to be higher as the driving voltage is smaller, for the following reason. That is, the members composing the hole-only devices 10A, other than the hole injection layer 4, were prepared according to the same manufacturing method. Thus, it could be assumed that the hole injection barrier between two adjacent layers, other than that between the hole injection layer 4 and the buffer layer 13 is uniform in each of the hole-only devices 10A. Considering the above, it could be expected that the differences in driving voltage of the hole-only devices 10A resulting from whether or not the surface of the hole injection layer 4 was exposed to UV light closely reflects the hole injection efficiency from the hole injection layer 4 to the buffer layer 13.

Table 2 illustrates each of the hole-only devices 10A and a driving voltage thereof.

TABLE 2

| Sample Name | Drive Voltage |
| --- | --- |
| HOD with Irradiation | 18.9 V |
| HOD without Irradiation | 19.7 V |

Figure 18:
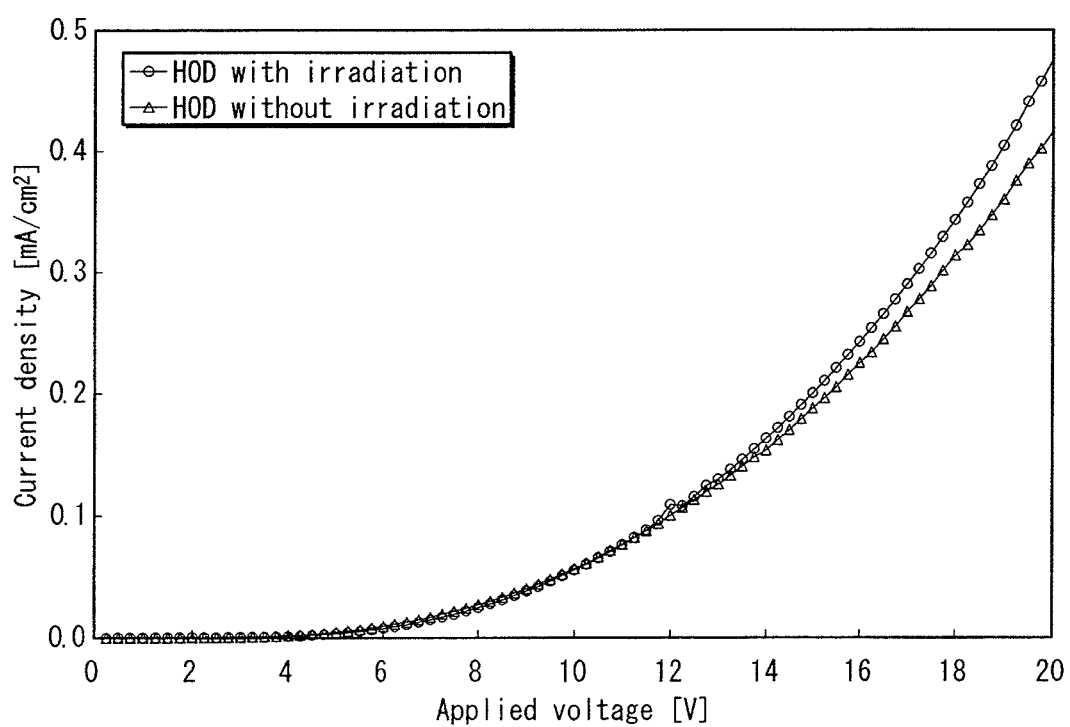
FIG. 18 is a device characteristics diagram showing a relation curve illustrating a relation between applied voltage and electric current density of hole-only devices.

In addition, FIG. 18 illustrates an electric current density-applied voltage curve of each of the hole-only devices 10A. In the figure, the vertical axis indicates electric current density (mA/cm$^2$), whereas the horizontal axis indicates applied voltage (V).

As shown in Table 2 and FIG. 18, when comparing the HOD with irradiation to the HOD without irradiation, the drive voltage is lower and the rising of the electric current density-applied voltage curve is quicker. Further, it could be seen that HOD with irradiation requires the lower level of applied voltage to reach a high electric current density compared with HOD without irradiation. That is, HOD with irradiation has a higher degree of hole injection efficiency compared with HOD without irradiation.

In the above, observation has been made of the hole injection efficiency of the hole injection layer 4 in each of the hole-only devices 10A. However, it should be emphasized that the hole-only devices 10A and the organic EL element 10 illustrated in FIG. 8 have nearly the same structure, differing only in the cathode 8A. That is, the organic EL element 10 is essentially the same as hole-only devices 10A in terms of the effect imposed by the adherent removal by the UV irradiation on the hole injection efficiency from the hole injection layer 4 to the buffer layer 13.

In order to confirm the above, two samples of organic EL element 10 were prepared. One of the samples was prepared using the hole injection layer 4 exposed to UV light, and the other of the samples was prepared using the hole injection layer 4 not exposed to UV light. Hereinafter, the former sample of the organic EL element 10 is referred to as "BPD with irradiation", whereas the latter is referred to as "BPD without irradiation". Except that the hole injection layer 4 of the BPD without irradiation was not exposed to UV light, the BPDs were manufactured by the manufacturing method according to the present embodiment.

Each sample organic EL element 10 thus prepared was connected to the DC voltage source, so that voltage was applied thereto. Further, the voltage applied to each sample was changed to measure the values of electric current flowing at different voltages. Each current value is then converted into a value per unit area (current density). Note that hereinafter, the "driving voltage" refers to a voltage applied to obtain a current density value of 10 mA/cm².

Table 3 illustrates each of the sample organic EL elements 10 and a driving voltage thereof.

TABLE 3

| Sample Name | Drive Voltage |
| --- | --- |
| BPD with Irradiation | 8.3 V |
| BPD without Irradiation | 9.2 V |

Figure 19:
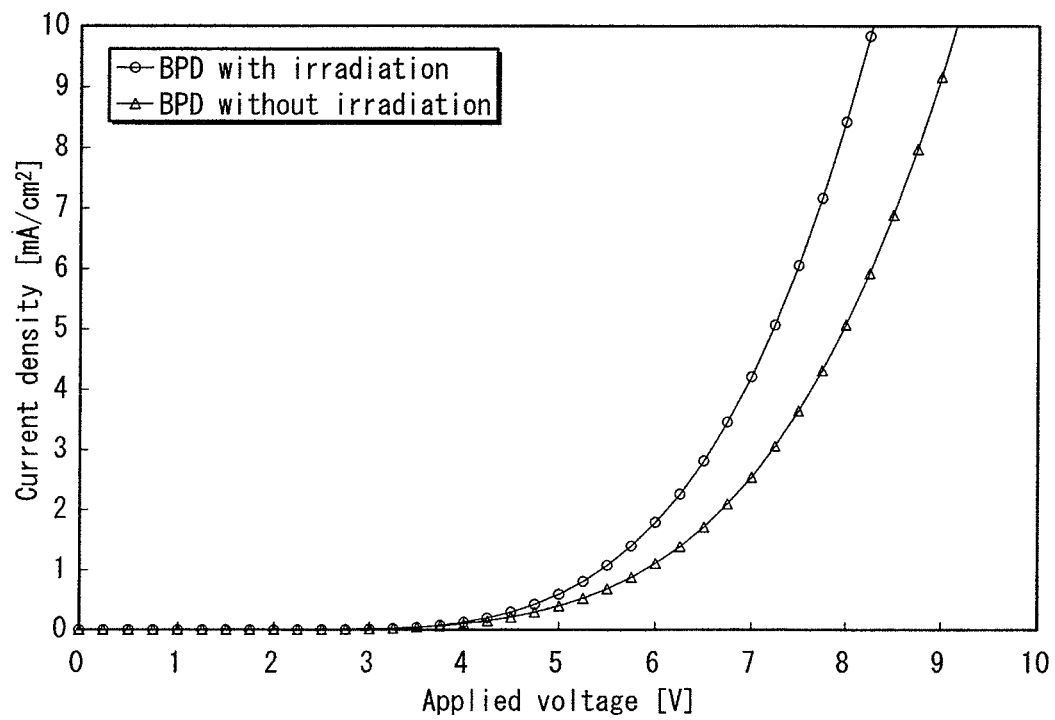
FIG. 19 is a device characteristics diagram showing a relation curve illustrating a relation between applied voltage and electric current density of organic EL elements prepared by the present inventors.

In addition, FIG. 19 illustrates an electric current density-applied voltage curve of each of the sample organic EL elements 10A. In the figure, the vertical axis indicates electric current density (mA/cm²), whereas the horizontal axis indicates applied voltage (V).

As shown in Table 3 and FIG. 19, when comparing the BPD with irradiation to the BPD without irradiation, the drive voltage is lower and the rising of the electric current density-applied voltage curve is quicker. Further, it could be seen that BPD with irradiation require the lower level of applied voltage to reach a high electric current density compared with BPD without irradiation. This tendency is the same as that observed with the HOD with irradiation and HOD without irradiation.

By the above experiments, it is confirmed regarding the organic EL element 10 that the effect imposed on the hole injection efficiency from the hole injection layer 4 to the buffer layer 13 as a result of removal of adherents by UV irradiation to the surface of the hole injection layer 4 is similar to that confirmed with the hole-only devices 10A.

By the above experiments, the following is confirmed. That is, by UV irradiation performed in a predetermined manner according to the present embodiment after the hole injection layer 4 is formed, adherents are removed to the maximum extent from the surface of the hole injection layer 4 without affecting the energy level resulting from structures similar to oxygen vacancies. This means that adherents, which are likely to cause increase of the drive voltage and decrease of the life of the organic EL element 10, are removed without impairing the hole injection ability. Consequently, the efficiency in injecting holes from the hole injection layer 4 to the buffer layer 13 is improved, so that excellent characteristics of the organic EL element is realized.

(5) Regarding Wavelength of Ultraviolet Light

According to the present embodiment, after the hole injection layer 4 is formed, adherents on the hole injection layer 4 are removed by radiating ultraviolet light of a predetermined wavelength in the atmosphere. An organic EL element 10 having the hole injection layer 4 having been subjected to the adherents removal operates on a lower drive voltage than an organic EL element manufactured without removal of adherents. The wavelength of ultraviolet light was determined through the following observations.

First, the wavelength of ultraviolet light that generates ozone ($O_3$) in a gas atmosphere containing oxygen molecules ($O_2$), such as in the atmosphere, is 184.9 nm. By the following reaction, the oxygen molecules are decomposed by ultraviolet light at 184.9 nm to yield oxygen radicals (O), which are then combined with remaining oxygen molecule to generate ozone.

In addition, the wavelength of ultraviolet light causing further decomposition of ozone to yield oxygen radicals again is 253.7 nm.

In UV ozone cleaning, ultraviolet light at 184.9 nm and at 253.7 nm is employed to generate oxygen radicals and their strong oxidation is used to remove adherents. Therefore, as observed in the experiments where the hole injection layer 4 was subjected to UV ozone cleaning, there is a risk of the energy level resulting from structures similar to oxygen vacancies disappearing almost completely when ultraviolet light having such a wavelength is used.

In view of the above risk, the present embodiment uses ultraviolet light in a wavelength region of 184.9 nm or longer as such ultraviolet light is not likely to cause decomposition of oxygen molecules to yield oxygen radicals. It is also desirable to use ultraviolet light within a wavelength region of 253.7 nm or longer in order to avoid decomposition of ozone to yield oxygen radicals, although the amount of ozone present in the atmosphere is small.

Figure 20:
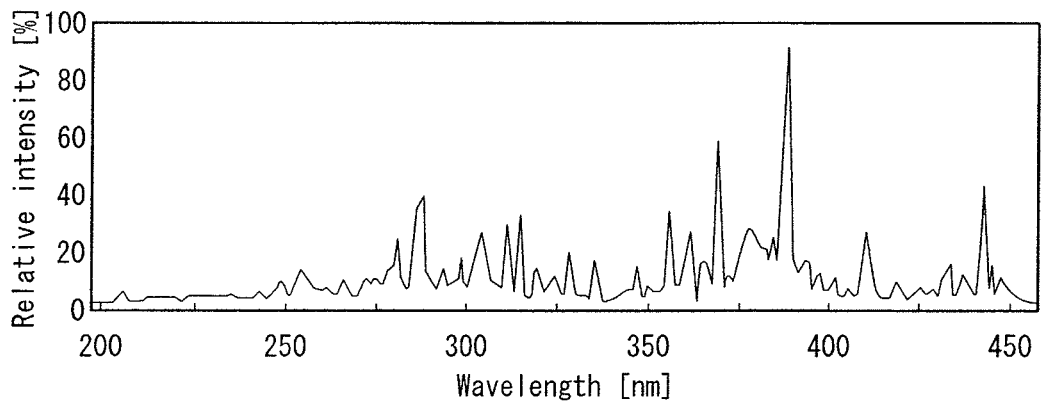
FIG. 20 illustrates the spectral distribution of a metal halide lamp employed in an embodiment.

The metal halide lamp actually used in the present embodiment has a spectral distribution illustrated in FIG. 20. As illustrated in the figure, the present embodiment uses a lamp that emits light of wavelengths of 253.7 nm or shorter as little as possible. In light emitted by the metal halide lamp, the intensity at 253.7 nm or shorter is at most a few percent of the maximum intensity (at about 380 nm).

Next, the binding energies between different combinations of atoms that may present in typical adherents are shown in Table 4. In the table, the mark "=" indicates double bond, whereas the mark "-" indicates single bond. To remove adherents, first, it is required to irradiate the layer surface with light having energy stronger than the bonding energies to break the bonds.

TABLE 4

| Binding | Binding Energy |
| --- | --- |
| C=C | 607 |
| C—C | 348 |
| C=O | 724 |
| C—O | 352 |
| C—H | 413 |
| O=O | 490 |

TABLE 4-continued

| Binding | Binding Energy |
|---------|----------------|
| O—O     | 139            |
| O—H     | 463            |

Note that the light energy E per mol of photons and the wavelength k are in the inverse proportion shown below.

$$E = Nhc/\lambda$$

(N: Avogadro's number, h: Planck's constant, c: velocity of light, and $\lambda$: wavelength)

From the above expression, the energy of ultraviolet light at the wavelength 184.9 nm is calculated to be 647 kJ/mol. Similarly, the energy of ultraviolet light at the wavelength 253.7 nm is calculated to be 472 kJ/mol. With reference to Table 4, the energy value of the ultraviolet light in the wavelength region determined according to the present embodiment is sufficient to disconnect most of atomic bonds typically appearing in adherents. Especially, as will be later described in detail, in the case of chemical adsorption, adherents mainly make single bonds to oxygen atoms present in tungsten oxide. The strongest single bond with atoms present in adherents is O—H bond with a bonding energy of 463 kJ/mol (corresponding to a wavelength of 258 nm) or so. Therefore, the ultraviolet light within the wavelength region of the present embodiment is strong enough to break the chemical bond. In the case of physical adsorption, the bonding is far weaker than chemical adsorption, so that such adherents are readily removed by UV irradiation.

The above describes the reason why the ultraviolet light used in the present embodiment is sufficient to remove adherents.

Indeed, the efficiency of adherent removal by the UV radiation according to the present embodiment is essentially lower than UV ozone cleaning. This is because the UV ozone cleaning ensures that adherents being unbonded are immediately oxidized with oxygen radicals to form molecules such as $CO_2$ and $H_2O$, which easily migrate. As has been already described, however, UV ozone cleaning is not suitable for cleaning the hole injection layer 4 composed of tungsten oxide.

To be noted next is that atomic bonds occurring in tungsten oxide is not generally broken by the energy of ultraviolet light within the wavelength region according to the present embodiment. According to Non-Patent Literature 3, for example, the binding energy between oxygen atom and tungsten atom in tungsten oxide is 672 kJ/mol (corresponding to a wavelength of 178 nm). That is, it is difficult to break the bond between oxygen atom and tungsten atom with ultraviolet light within the wavelength region according to the present embodiment. This is in contrast with the above-described sputter etching performed in vacuum by using argon ion. With the use of ultraviolet light according to the present embodiment, adherents are removed without breaking atomic bonds present in the hole injection layer 4 composed of tungsten oxide. That is, adherents are removed without making the hole injection layer 4 chemically active, i.e., while the hole injection layer 4 is chemically stable.

For the reasons described above, one aspect of the present disclosure uses ultraviolet light at a wavelength of 184.9 nm or longer, preferably 253.7 nm or longer. Note that visible light is generally incapable of breaking the bond of chemical adsorption. The present embodiment therefore uses ultraviolet light (380 nm or shorter), rather than visible light.

(6) Reason for which Energy Level Affecting Hole Injection Ability is Maintained after UV Irradiation According to the present embodiment, the energy level resulting from structures similar to oxygen vacancies on the layer surface is continuously maintained even after UV irradiation and thus the hole injection ability is maintained with stability. That is, the present embodiment ensures manufacturing of organic EL elements which operate at low drive voltage. This property of maintaining the energy level is analyzed below.

It has been frequently reported, with reference to results of experiments and first principles calculations, that existence of the energy level which can be seen in a thin film of, or a crystal of tungsten oxide, derives from structures similar to oxygen vacancies. More specifically, it is assumed that the existence of the energy level of interest results from bonding orbitals formed, by the absence of oxygen atoms, from the 5d orbitals of adjacent tungsten atoms and also results from the 5d orbitals of singular tungsten atoms not terminated with an oxygen atom and exist on the layer surface or within the layer.

Here, it may be assumed that 5d orbitals of tungsten atoms are more stable when adherents are chemically absorbed thereto, as compared with the case where the 5d orbitals are present as bonding orbitals or as the 5d orbitals of singular tungsten atoms. However, such an assumption is not necessarily correct. Actually, as observed in the UPS spectra illustrated in FIG. 12, tungsten oxide left to stand in the atmosphere for two days exhibits a spectral protrusion near the Fermi surface, which is the indication of the energy level being discussed.

Figure 21:
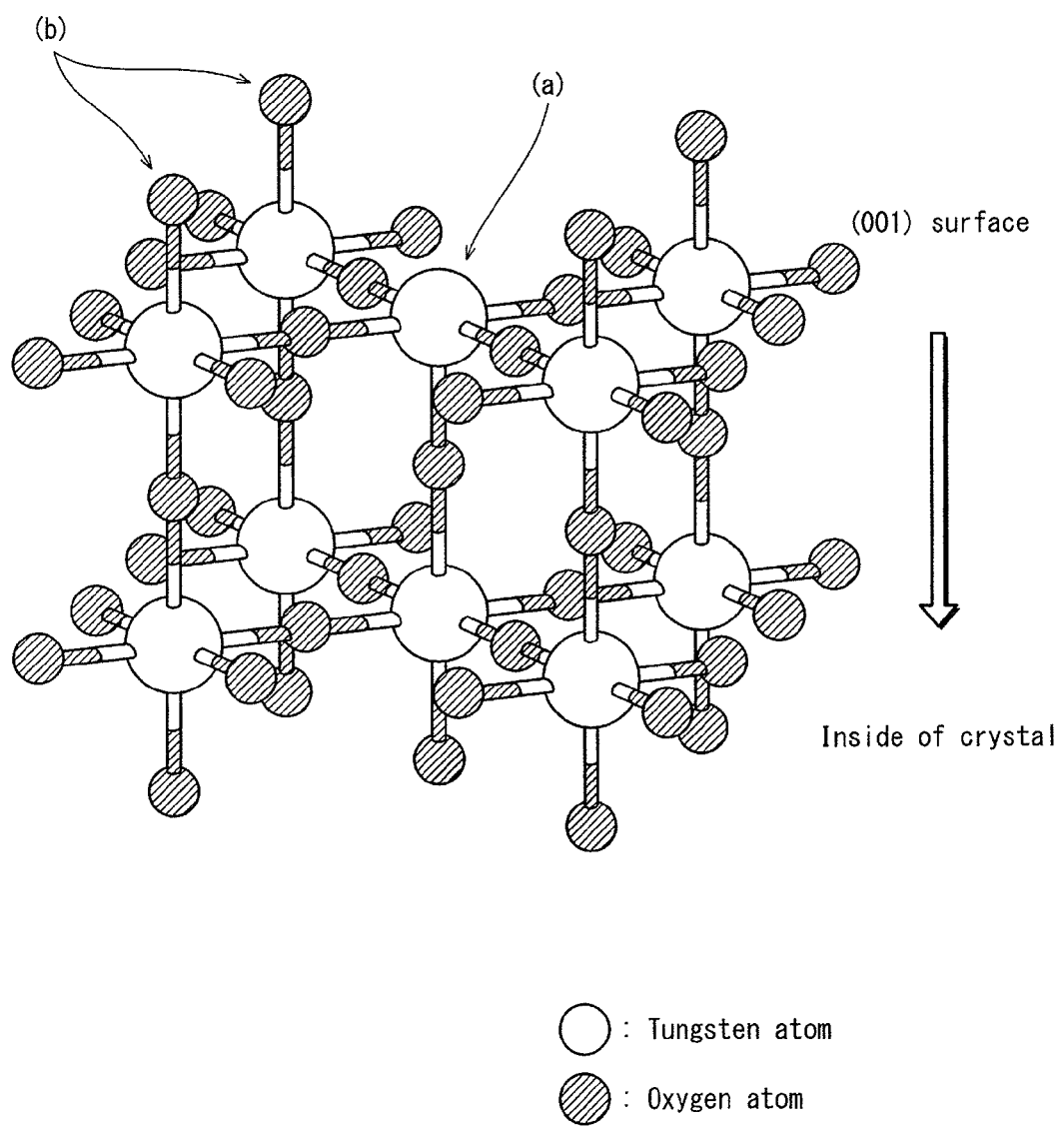
FIG. 21 illustrates the surface configuration of tungsten oxide.

In Non-Patent Literature 4, it has been reported that when tungsten trioxide single crystal is cleaved in vacuum to expose the clean (001) surface, part of oxygen atoms present on the outermost surface are emitted. Non-Patent Literature 4 further reports the following reason, which has been confirmed by the first principles calculations, for which the (001) surface is more stable in terms of energy when a tungsten atom (a) not terminated with an oxygen atom is periodically present on the outermost surface as shown in FIG. 21 than when all the tungsten atoms are terminated with oxygen atoms. That is, when all the tungsten atoms present on the outermost surface are terminated with oxygen atoms, the electrical repulsive force occurring between terminal oxygen atoms becomes large, which causes the instability. In short, the (001) surface is more stable when structures similar to oxygen vacancies (a) are present on the surface.

FIG. 21 illustrates tungsten oxide atoms each surrounded by six oxygen atoms to form an octahedron with the six oxygen atoms at the vertices. For the simplicity sake, in the figure, the octahedrons are arranged in orderly succession in a manner similar to the rhenium oxide structure. In practice, however, the octahedrons are distorted to some extent and arranged without such orderliness.

By analogy with the above findings, the following mechanism may be one example of the reason for which the energy level resulting from structures similar to oxygen vacancies is maintained on the surface of the hole injection layer 4 continuously after the UV irradiation according to the present embodiment.

According to the present disclosure, the hole injection layer 4 composed of tungsten oxide is assumed to have a (001) facet at least locally on the layer surface immediately after the formation of the hole injection layer 4. That is, as illustrated in FIG. 21, the hole injection layer 4 is assumed to have terminal oxygen atoms (b) and tungsten atoms not terminated with an oxygen atom (a). Non-terminated tungsten atoms (a) are surrounded by terminal oxygen atoms (b). It is because the (001) surface has a stable structure. It is this surface that is exposed to impurity molecules and atomic molecules in the chamber of the sputtering film-forming apparatus subsequently to the formation of the hole injection layer 4.

In general, if unsaturated metal atoms such as (a) are present on the layer surface of metal oxide, the metal atoms tend to be terminated with a water or organic molecule as a result of chemical adsorption. In the present embodiment, however, none of the W4f spectra illustrated in FIG. 16 has a peak in a binding energy range from 31 eV to 33 eV at which a peak derived from the bonding between a tungsten atom and a carbon atom should appear. Instead, each W4f spectra illustrated in FIG. 16 has a peak derived from the bonding between a tungsten atom and an oxygen atom. It is therefore highly likely that the atoms of adsorbed molecules to which tungsten atoms (a) are chemically bonded are oxygen atoms.

However, for example, a tungsten atom (a) may chemically react with a water molecule to form a hydroxyl group or a tungsten atom (a) may chemically react with an organic molecule to be bonded to an oxygen atom contained in the organic molecule. In such cases, a repulsive force is generated between an adsorbed oxygen atom, which generally is negatively charged, and adjacent terminal oxygen atoms (b), which are also negatively charged. In view of the above, it is expected that adsorption of molecules to tungsten atoms (a) is relatively unlikely, for the same reason for which tungsten atoms (a) are unlikely to have terminal oxygen atoms in vacuum.

On the other hand, terminal oxygen atoms (b) surrounding tungsten atoms (a) undergo addition reaction with water molecules and organic molecules to cause chemical adsorption. Such chemical adsorption occurs relatively easily as there is substantially no factor inhibiting adsorption, such as repulsive force. In some cases, the chemical adsorption to terminal oxygen atoms (b) may result in that organic molecules composed of a few or more atoms are present in the immediate vicinity of tungsten atoms (a). Such organic molecules act as spatial barriers against adsorbing molecules. Therefore, adsorption of molecules to terminal oxygen atoms (b) is also expected to prevent adsorption of molecules to tungsten atoms (a).

From the above consideration, in the layer surface having: terminal oxygen atoms (b); and tungsten atoms (a) not terminated with an oxygen atom and surrounded by the terminal oxygen atoms (b) as illustrated in FIG. 21, the occurrence of chemical adsorption to the tungsten atoms (a) is less likely. Instead, impurity molecules and atomic molecules tend to chemically adhere to the terminal oxygen atoms (b) surrounding tungsten atoms (a). Note that the chemical adsorption occurring in this case is a bond via a terminal oxygen atom and thus generally is a single bond.

In response to the UV irradiation according to the present embodiment, only molecules chemically bonded to oxygen atoms (b) are disconnected and released. As a result, it is expected that the oxygen atoms (b) revert to terminal oxygen atoms as they were before the chemical adsorption or react with water molecules to form hydroxyl groups, which are stable and not easily disconnected by the UV irradiation according to the present embodiment.

To summarize the above, the hole injection layer 4 composed of tungsten oxide according to the present embodiment has, on the layer surface, the local structure as illustrated in FIG. 21. That is, tungsten atoms (a) not terminated with an oxygen atom are surrounded by terminal oxygen atoms (b). First of all, this structure per se has a characteristic which prevents adsorption of molecules. In addition, molecules adhered to terminal oxygen atoms (b) are released by UV irradiation, after which hydroxyl groups mainly remain present on the layer surface. In this manner, while adherents are removed by UV radiation performed after the layer formation, the electronic state resulting from structures similar to oxygen vacancies (a) on the layer surface is maintained without being affected by the UV irradiation. The electron state thus maintained positively affects the hole injection ability.

(7) Thinning of the Hole Injection Layer

The present inventors found that during the manufacturing process of the organic EL element having the hole injection layer, the thickness of the hole injection layer is reduced. The present inventors assumed that the thinning of the hole injection layer occurred in the bank forming process. In order to find a cause of the thinning phenomenon of the hole injection layer, the following experiments were conducted.

In the experiments, samples were prepared in the following manner. Then, the film density and the film thinning amount of each of the samples were measured. Specifically, a thin film composed of tungsten oxide, which was to become a hole injection layer, was formed on a glass substrate by a sputtering method (the film forming conditions being the same as those for the hole-only devices 10A). Thereafter, a resin material layer composed of a predetermined resin material (a material of "TFR" series manufactured by Tokyo Ohka Kogyo Co., Ltd.) was formed on the hole injection layer based on a spin coating method (at room temperature; 2500 rpm/25 sec) and baked (100° C.; 90 sec). Next, a developing process (using TMAH 2.38% solution; developing time being 60 sec) and a washing process (using pure water, washing time being 60 sec) were performed. Then, the resin material layer was removed. The formation of the resin material layer, the developing process, and the washing process as described above were performed by simulating the actual bank forming process.

Table 5 shows conditions under which the samples were prepared, and the measurement result of the film density and the film thinning amount. As shown in Table 5, thinning of the hole injection layer was confirmed in each sample. For example, it was confirmed that sample A had a thickness of 80 nm immediately after the film forming process. However, the thickness of sample A ultimately became approximately 23 nm. This means that the thickness of sample A was reduced by approximately 57 nm by film thinning.

TABLE 5

|  | Sample Device | | |
|---|---|---|---|
|  | Sample Device A | Sample Device B | Sample Device C |
| Total Pressure (Pa) | 4.8 | 2.7 | 2.7 |
| Ar:$O_2$ | 100:100 | 43:100 | 43:100 |
| Input Power (W) | 250 | 500 | 1000 |
| Film density (g/cm$^3$) | 5.43 | 6.09 | 6.33 |
| Film thinning amount (nm) | 57.7 | 25 | 20.9 |
| Remarks/Film-forming device | SMD | SOLCIET | SOLCIET |

The present inventors examined the cause of thinning of the hole injection layer, and found that the hole injection layer dissolves to solvents used during the developing process and/or the washing process, and this causes film thinning. The density of the hole injection layer is reduced by structures similar to oxygen vacancies. This is assumingly because a large number of micro-crystal structures are formed inside the tungsten oxide layer. Specifically, when a large number of micro-crystal structures are formed inside the hole injection layer, solvents (i.e., developing solution, cleaning liquid, etc.) used during the film forming process pertaining to the formation of the bank are more likely to infiltrate into the hole injection layer, resulting in the occurrence of film thinning.

Figure 22:
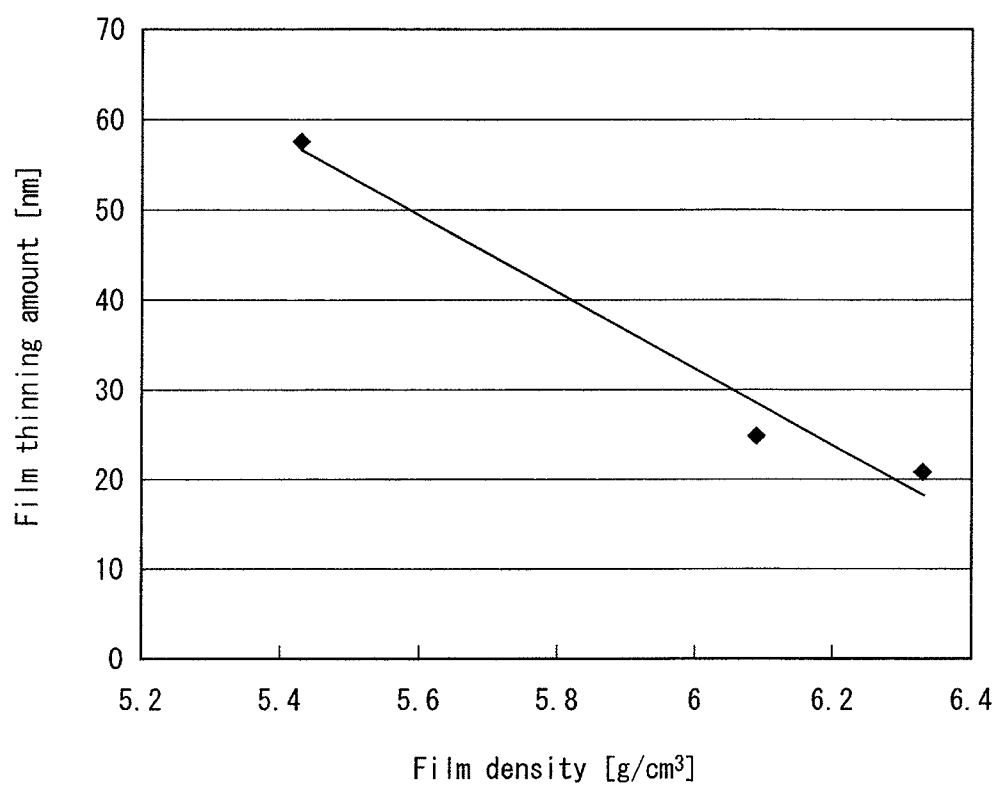
FIG. 22 is a graph illustrating a relation between film thinning amount and film density of a tungsten oxide film.

FIG. 22 is a graph illustrating a relation between film thinning amount and film density of the hole injection layer. FIG. 22 summarizes the measurement result shown in Table 5. As illustrated in FIG. 22, there is a strong causal relation between the thinning amount and density of the hole injection layer. Specifically, the lower the density of the hole injection layer, the larger the thinning amount of the hole injection layer. The present inventors assume that the thinning amount of the hole injection layer increases because of the following reason. The hole injection layer has the structure deriving from oxygen vacancy, which allows for excellent hole injection characteristics and a low driving voltage for the organic EL element. However, due to structures similar to oxygen vacancies, solvents (i.e., developing solution, cleaning liquid, etc.) used during the film forming process pertaining to the formation of the bank are more likely to infiltrate into the hole injection layer. This is considered to be the cause of the thinning amount of the hole injection layer being large.

In general, film thinning as described above complicates the management of the thickness of the tungsten oxide film. Also, there is a concern that such film thinning may affect the hole injection characteristics in some way after the completion of the organic EL element. For this reason, if a person skilled in the art finds out the occurrence of the thinning of a hole injection layer, the person may hesitate to form the hole injection layer by using tungsten oxide.

However, the present inventors conducted extensive research on this point, and found that adjustment in the thinning amount of the tungsten oxide film is possible, for example, by appropriately changing developing conditions (i.e., reducing the concentration of the developing solution from 2.38% to approximately 0.2%) or by appropriately changing baking conditions. Such adjustment can control the thickness of the tungsten oxide film in view of film thinning. Based on the technology pertaining to the adjustment in the thinning amount of the hole injection layer, the present inventors further conducted examination on realistic organic EL elements and made prototypes thereof. As a result, the following technical matters were confirmed.

Steps of making the prototypes of organic EL elements are as follows. First, a hole injection layer including tungsten oxide was formed on an anode. Next, a bank material layer was disposed on the hole injection layer. Then, the bank material layer was patterned into a predetermined shape having an aperture. The aperture is created for the purpose of forming a functional layer therein. At this point, processes of exposure, developing, and washing were performed. Subsequently, the functional layer was formed on an area of the hole injection layer corresponding to the aperture. Then, a cathode was formed on the functional layer.

The present inventors examined the structure of an organic EL element obtained through the above process, and confirmed that the organic EL element has the following structure. That is, in the area of the hole injection layer corresponding to the aperture, a concavity is formed as a result of the tungsten oxide being dissolved. Due to this concavity, the hole injection layer has a recessed structure as a whole.

The present inventors focused on a boundary portion between an inner bottom surface and an inner side surface of the recess of the hole injection layer, and found that by applying an ink material constituting a functional layer to the inner surface of the recess including the boundary portion, a favorable functional layer having an improved wettability can be formed.

Accordingly, the present inventors conceived the following structure. That is, in a region defined by the bank, a surface of the hole injection layer at the side of the functional layer is formed to have a recess, and the inner surface of the recess is in contact with the functional layer. This structure is described in detail in Embodiment 1 above.

Embodiment 2

An organic EL element according to Embodiment 2 is greatly different from the organic EL element according to Embodiment 1 in that the ITO layer is not formed under the hole injection layer and that a protection film is formed on the hole injection layer. The following explanation focuses on the difference from Embodiment 1, and explanation of the same structure as Embodiment 1 will be simplified or omitted.

<Structure of Organic EL Element>

Figure 23:
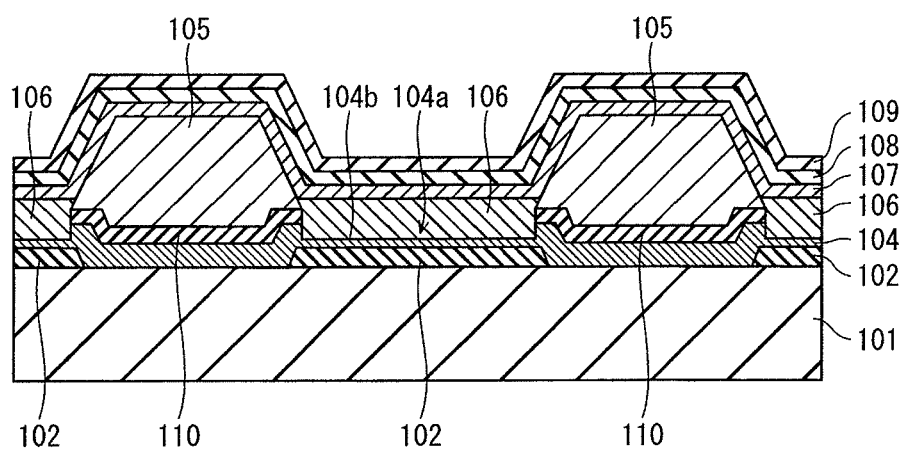
FIG. 23 is a schematic view showing a layered condition of layers constituting an organic EL element according to Embodiment 2.

FIG. 23 is a schematic view showing a layered condition of layers constituting an organic EL element according to Embodiment 2. As shown in FIG. 23, an organic EL element according to Embodiment 2 includes an anode 102, a hole injection layer 104 as a charge injection transport layer, and a protective layer 110 which are disposed on a substrate 101 in this order. Note that the hole injection layer 104 is formed across an entire upper surface of the substrate 101, but the protective layer 110 is not formed above the anode 102. In addition, an ITO layer does not exist between the anode 102 and the hole injection layer 104.

On the hole injection layer 104, a bank 105 for defining pixels is formed. A light-emitting layer 106 is layered in a region defined by the bank 105, and on the light-emitting layer 106, an electron injection layer 107, a cathode 108, and a passivation layer 109 are formed so as to be continuous with respective layers of an adjacent pixel, passing over the region defined by the bank 105.

<Manufacturing Method of Organic EL Element>

Figure 24A:
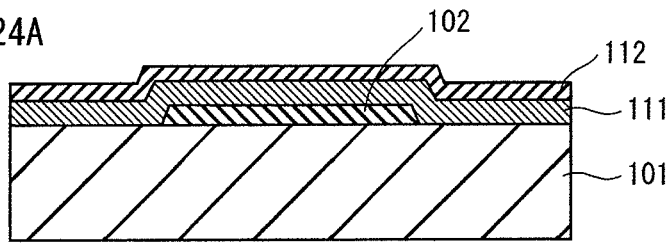
FIGS. 24A to 24D are processing drawings for explaining a method of manufacturing the organic EL element according to Embodiment 2.

FIGS. 24A to 24D are processing drawings for explaining a method of manufacturing an organic EL element according to Embodiment 2. In the manufacturing process of the organic EL element according to Embodiment 2, as shown in FIG. 24A, first, on the substrate 101 that is made of glass, the anode 102 is formed with an aluminum-based (Al) material. Next, a thin film 111 made of tungsten oxide, which will be the hole injection layer 104 later, is formed on the anode 102. Then a thin film 112 made of tungsten oxide, which will be the protective layer 110, is formed on the thin film 111. The thin film 112 protects the hole injection layer 104 during etching for forming the bank 105.

Figure 24B:
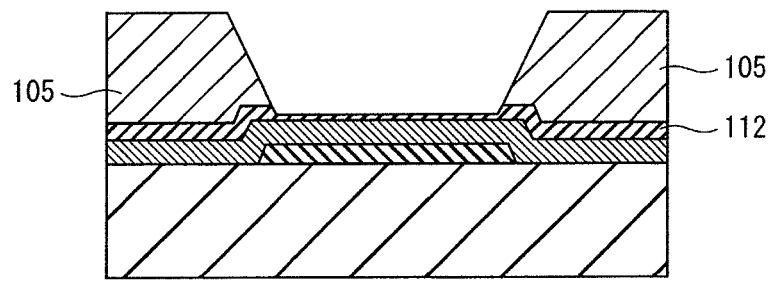

Next, as shown in FIG. 24B, the bank 105 is formed on the thin film 112. To be specific, a resist film including a resist material is formed on the thin film 112, and a resist pattern is formed on the film. After that, a desired portion of the resist film is etched by applying a developing solution, and is removed to form a pattern of the bank 105. Note that after formation of the bank 105, an impure substance such as hydrofluoric acid remaining on a surface of the bank 105 is cleaned by a cleaning liquid such as pure water so as to be removed, and a region defined by the bank 105 on an upper surface of the thin film 112 is melted by the cleaning liquid and becomes recessed.

Figure 24C:
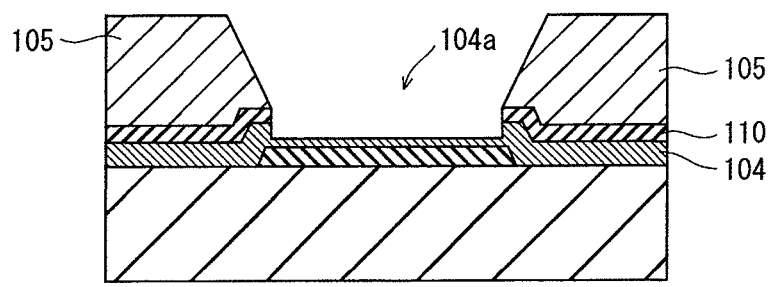

Furthermore, as shown in FIG. 24C, as the treatment with the cleaning liquid continues, the entire region defined by the bank 105 on the thin film 112 melts and accordingly the protective layer 110 is formed. When the thin film 112 melts, the thin film 111 is exposed. As a result, the region defined by the bank 105 on the upper surface of the thin film 111 melts and becomes recessed and then a recessed portion 104a is formed. Thus, the hole injection layer 104 is formed.

Figure 24D:
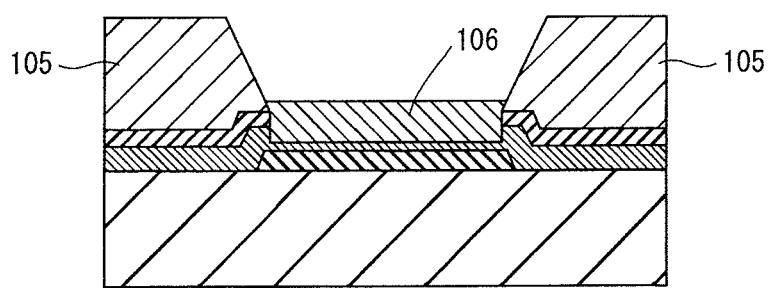

Next, as shown in FIG. 24D, the light-emitting layer 106 is formed within the region defined by the bank 105. Subsequent processes are the same as in Embodiment 1, and therefore a description thereof is omitted.

Embodiment 3

An organic EL element according to Embodiment 3 is greatly different from the organic EL element according to Embodiment 2, with respect to an area at which a hole injection layer is formed. The following explanation focuses on the difference from Embodiment 2, and explanation of the same structure as Embodiment 2 will be simplified or omitted.

<Structure of Organic EL Element>

Figure 25:
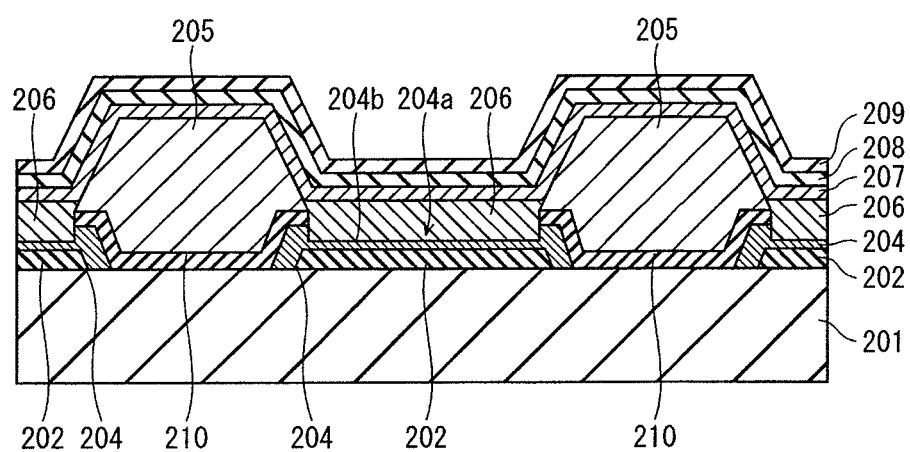
FIG. 25 is a schematic view showing a layered condition of layers constituting an organic EL element according to Embodiment 3.

FIG. 25 is a schematic view showing a layered condition of layers constituting an organic EL element according to Embodiment 3. As shown in FIG. 25, an organic EL element according to Embodiment 3 includes an anode 202, a hole injection layer 204 as a charge injection transport layer, and a protective layer 210 which are disposed on a substrate 201 in this order. Note that the hole injection layer 204 is not formed across the entire upper surface of the substrate 201, but formed only on the anode 202 and at a surrounding area of the anode 202. On the other hand, the protective layer 210 is not formed on the anode 202.

On the hole injection layer 204, a bank 205 for defining pixels is formed. A light-emitting layer 206 is layered in a region defined by the bank 205, and on the light-emitting layer 206, an electron injection layer 207, a cathode 208, and a passivation layer 209 are formed so as to be continuous with respective layers of an adjacent pixel, passing over the region defined by the bank 205.

<Manufacturing Method of Organic EL Element>

Figure 26A:
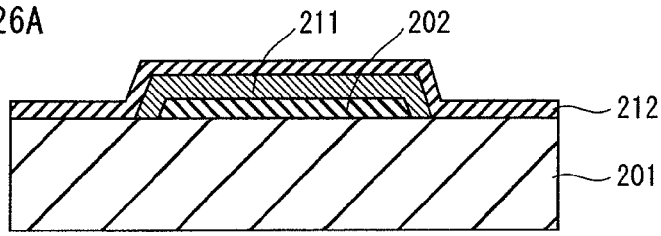
FIGS. 26A to 26D are processing drawings for explaining a method of manufacturing the organic EL element according to Embodiment 3.

FIGS. 26A to 26D are processing drawings for explaining a method of manufacturing an organic EL element according to Embodiment 3. In the manufacturing process of the organic EL element according to Embodiment 3, as shown in FIG. 26A, first, on the substrate 201 that is made of glass, the anode 202 is formed with an Al material. Next, an oxide film 211 that will be the hole injection layer 204 is formed by oxidizing an exposed surface (upper surface and side surface) of the anode 202. Then a thin film 212 made of tungsten oxide, which will be the protective layer 210 later, is formed on the oxide film 211.

Figure 26B:
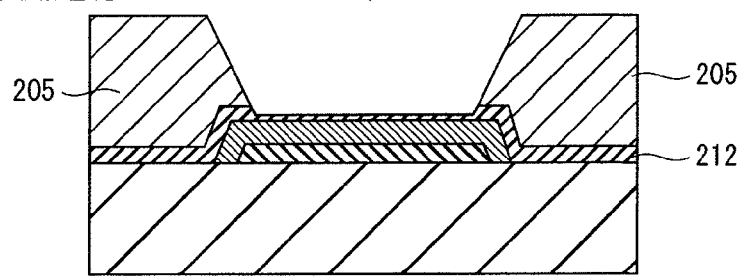

Next, as shown in FIG. 26B, the bank 205 is formed on the thin film 212. An impure substance such as hydrofluoric acid remaining on a surface of the bank 205 is cleaned by a cleaning liquid such as pure water so as to be removed, and a region defined by the bank 205 on an upper surface of the thin film 212 is melted by the cleaning liquid and becomes recessed.

Figure 26C:
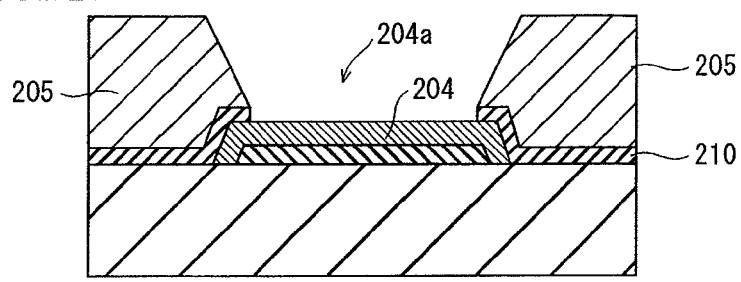

Furthermore, as shown in FIG. 26C, as the treatment with the cleaning liquid continues, the entire region defined by the bank 205 on the thin film 212 melts and accordingly the protective layer 210 is formed. In addition, when the thin film 212 melts, the region defined by the bank 205 on the oxide film 211 is exposed. Accordingly, the upper surface of the region also melts and becomes recessed, and then the recessed portion 204a is formed. Thus, the hole injection layer 204 is formed.

Figure 26D:
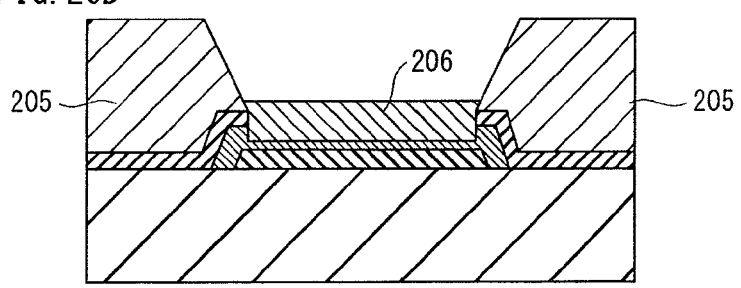

Next, as shown in FIG. 26D, the light-emitting layer 206 is formed within the region defined by the bank 205. Subsequent processes are the same as in Embodiment 2, and therefore a description thereof is omitted.

Embodiment 4

Figure 27:
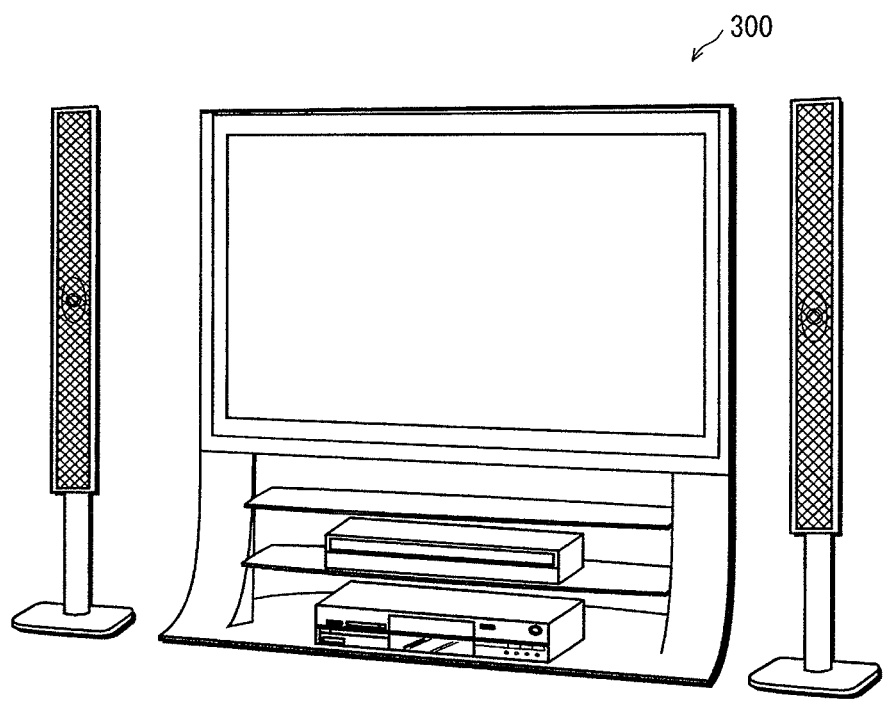
FIG. 27 is a perspective view showing apparatuses such as a display apparatus according to Embodiment 4.

FIG. 27 is a perspective view showing apparatuses such as a display apparatus according to Embodiment 4. As shown in FIG. 27, a display apparatus 300 according to one aspect of the present disclosure is an organic EL display formed by a plurality of pixels arranged in a matrix. Each pixel emits a color corresponding to one of R (red), G (green), and B (blue) and composed of an organic EL element according to one aspect of the present disclosure.

Figure 28:
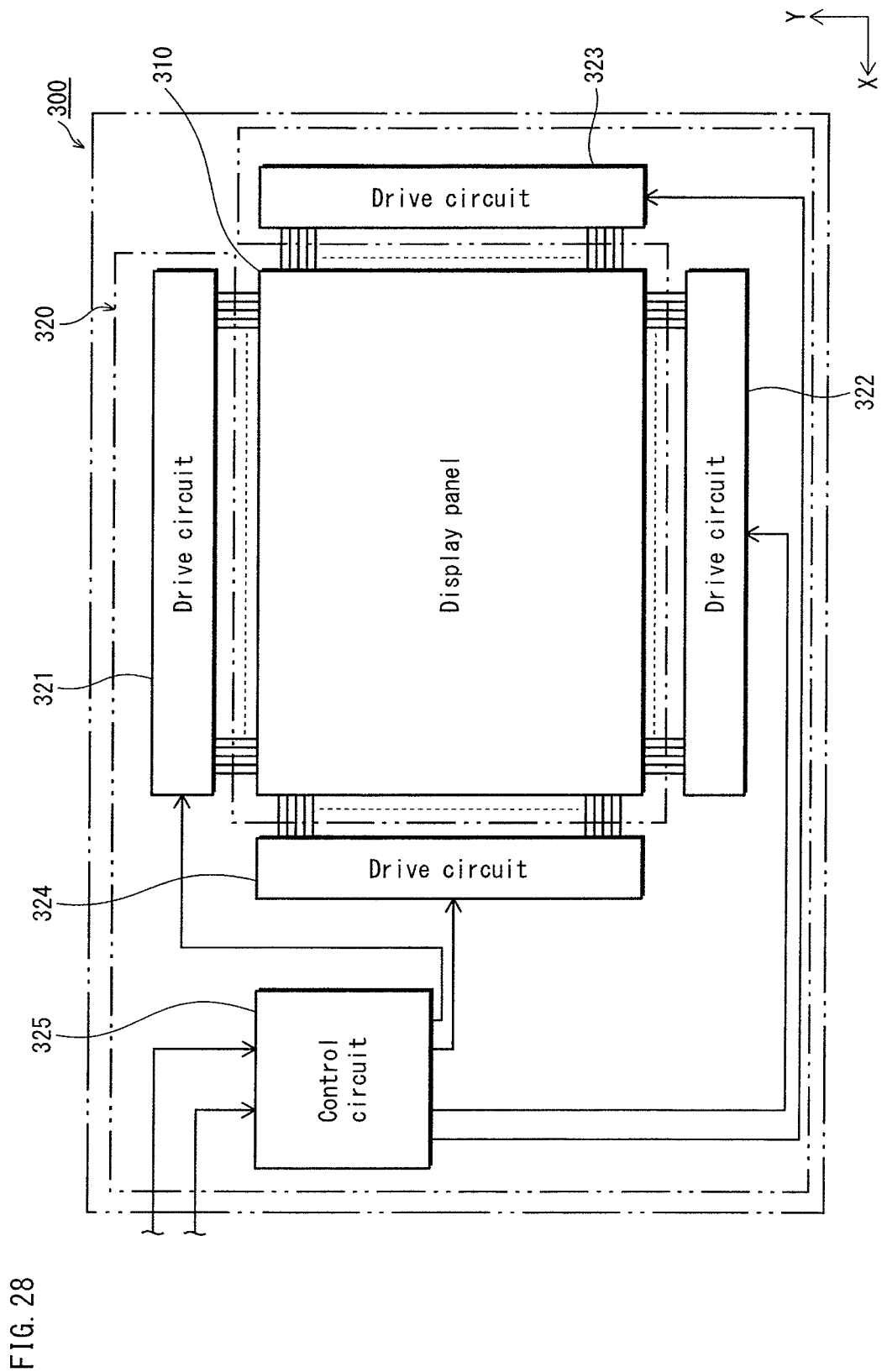
FIG. 28 illustrates an overall structure of the display apparatus according to Embodiment 4.

FIG. 28 illustrates an overall structure of a display apparatus according to Embodiment 4. As illustrated in FIG. 28, the display apparatus 300 includes a display panel 310 having organic EL elements manufactured by the method according to one aspect of the present disclosure and also includes a drive control unit 320 connected to the display panel 310. The display apparatus 300 may be used, for example, in a display, television, and mobile phone. The drive control unit 320 includes four drive circuits 321-324 and a control circuit 325. However, in an actual display apparatus 300, the arrangement and connection of the drive control unit 320 with respect to the display panel 310 is not limited to those as described above.

The display apparatus 300 having the above structure is excellent in its image quality owing to the excellent light-emitting characteristics of the organic EL elements.

Embodiment 5

Figure 29A:
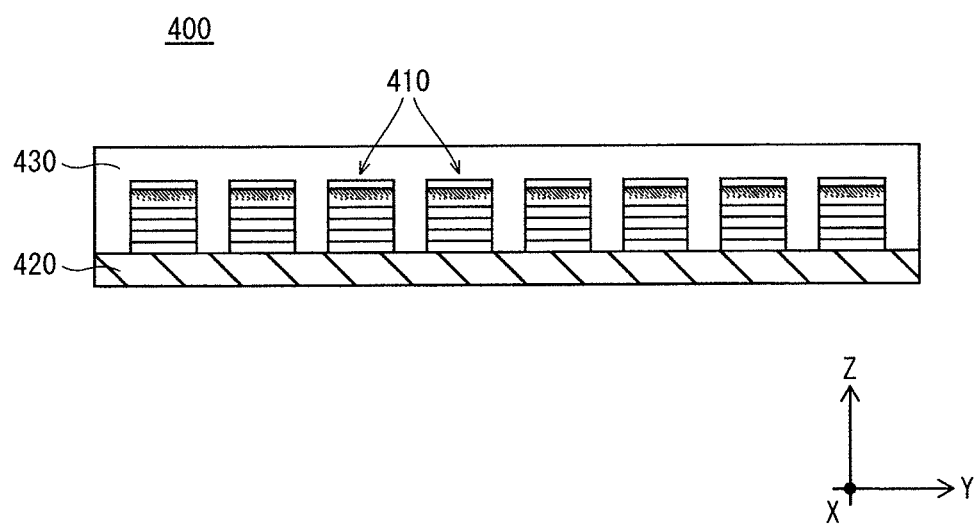
FIGS. 29A and 29B illustrate a light-emitting apparatus according to Embodiment 5, where
Figure 29B:
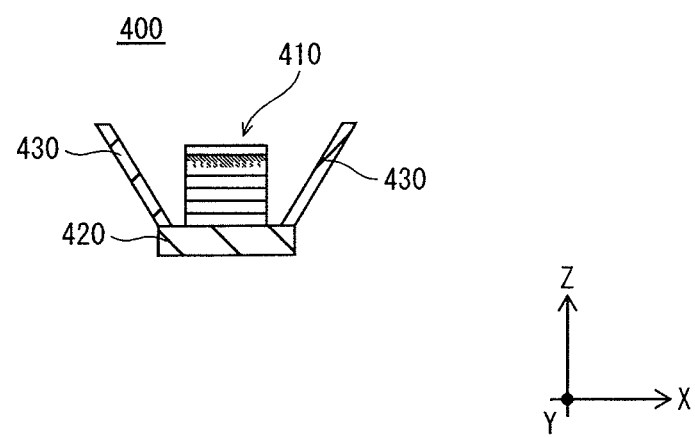

FIGS. 29A and 29B illustrate a light-emitting apparatus according to Embodiment 5. More specifically, FIG. 29A is a longitudinal sectional view, whereas FIG. 29B is a transverse sectional view. As shown in FIGS. 29A and 29B, a light-emitting apparatus 400 includes: organic EL elements 410 manufactured by a method according to one aspect of the present disclosure; a base 420 having the organic EL elements 410 mounted on its upper surface; and a pair of reflecting members 430 disposed to flank an array of the organic EL elements 410. The light-emitting apparatus 400 may be used as an illuminator and a light source. The organic EL elements 410 are electrically connected to a conductive pattern (not illustrated) formed on the base 420 and emit light with power supplied via the conductive pattern. Part of light emitted from the organic EL elements 410 is reflected by the reflecting members 430, whereby the light distribution is controlled.

The light-emitting apparatus 400 having the above structure is excellent in its image quality owing to the excellent light-emitting characteristics of the organic EL elements.

<Modification>

Up to this point, an organic EL element, a display apparatus, and a light-emitting apparatus according to one aspect of the present disclosure have been specifically described. However, the specific embodiments described above are examples used in order to clearly illustrate a structure of the present disclosure and the effects and advantages thereof. The present disclosure is not limited to the specific embodiments described above. For example, the sizes and/or materials specifically mentioned are merely typical examples used to make it easier to understand the present disclosure. The present disclosure is not limited to such specific sizes and/or materials.

The hole injection layer according to one aspect of the present disclosure is not limited to a layer composed of tungsten oxide, as long as it includes tungsten oxide. For example, the hole injection layer may be composed of molybdenum tungsten oxide (MoxWyOz). In the composition formula (MoxWyOz) denoting the composition of the molybdenum tungsten oxide, z is a real number existing within a range of approximately 2<z<3, provided that x+y=1. The molybdenum tungsten oxide may include a trace level of impurities, provided that the amount does not exceed the amount of impurities which may be incorporated as a result of normal processing. The hole injection layer composed of molybdenum tungsten oxide can achieve the same advantageous effect as the hole injection layer composed of tungsten oxide.

Further, the implementation of the organic EL element of the present disclosure is not limited to a structure where the organic EL element is used alone. A plurality of organic EL elements of the present disclosure may be integrated on a substrate as pixels to form an organic EL panel. An organic EL display so yielded may be implemented by appropriately arranging the thickness of each of the layers in each of the organic EL elements.

In the manufacture of organic EL panels using application-type organic EL elements, the step of integrating a plurality of organic EL elements as pixels on a substrate is performed in the following manner, for example. That is, banks defining the pixels are formed on the hole injection layer composed of tungsten oxide and functional layers are overlaid within the regions defined by the banks. The step of forming the banks is performed in the following manner, for example. First, a bank material composed of photosensitive resist material is applied onto the surface of the hole injection layer, followed by pre-baking of the bank material. Then, the bank material is exposed to light via a pattern mask to remove unhardened, redundant bank material with a developer, followed by rinsing with pure water. The present disclosure is applicable to the hole injection layer composed of tungsten oxide having undergone the bank forming step as above. In this case, by performing the UV irradiation of the surface of the hole injection layer after the banks are formed, organic molecules, which are residues of banks and developer, are removed from the surface of the hole injection layer. In general, irradiating banks with ultraviolet light results in changes in the contact angle of each bank with respect to an organic solvent applied as an upper layer. Yet, according to the present disclosure, it is easy to uniformly determine the irradiation conditions of ultraviolet light. Therefore, the contact angle and the bank configuration can be appropriately adjusted in view of the uniformly determined irradiation conditions.

The organic EL element according to one aspect of the present disclosure may be a so-called bottom emission type or a top emission type.

In the manufacturing method for organic EL elements according to one aspect of the present disclosure, the UV irradiation is performed in the ambient atmosphere. Alternatively, however, the UV irradiation may be performed in various other gas atmospheres, such as reduced-pressure atmosphere, inert gas atmosphere, or vacuum. The above variations are possible because the cleaning by UV irradiation uses ultraviolet light at such wavelengths not generating oxygen radicals. Still, however, the UV irradiation performed in the atmosphere is advantageous in the manufacture of large-sized panels, for the reasons stated above.

INDUSTRIAL APPLICABILITY

The organic EL element according to the present disclosure is to be used as display elements for mobile phone displays and TVs, and as a light source for various applications. Regardless of the specific use thereof, the organic EL element of the present disclosure is applicable as an organic EL element having a wide range of luminous intensity from low luminous intensity to high luminous intensity for the use as a light source or the like, and which can be driven at a low voltage. The organic EL element of the present disclosure, for having such a high level of performance, may be used in a wide range of applications, including those for household use, those for use in public facilities, and those for professional use. More specifically, such applications include: various display devices; TV apparatuses; displays for portable electronic devices; illumination light sources, and etc.

REFERENCE SIGNS LIST 2 anode
4 hole injection layer
4a recessed portion
4b inner surface
4c inner bottom surface
4d inner side surface
4e upper edge
5 bank
5a bottom surface
5d lower edge
6 light-emitting layer
6a bottom surface
6b side surface
8 cathode
10 organic EL element
300 display apparatus
400 light-emitting apparatus

The invention claimed is:
1. An organic EL element, comprising:
an anode;
a cathode;
a functional layer that is disposed between the anode and the cathode and includes at least a light-emitting layer made of an organic material;
a hole injection layer disposed between the anode and the functional layer; and
a bank that defines a region in which the light-emitting layer is to be formed, wherein
the hole injection layer contains tungsten oxide,
an Ultraviolet Photoelectron Spectroscopy (UPS) spectrum, obtained from a UPS measurement, has a protrusion appearing near a Fermi surface and within a region corresponding to a binding energy range lower than a top of a valence band,
the tungsten oxide contained in the hole injection layer satisfies a condition, determined from an X-ray Photoelectron Spectroscopy (XPS) measurement, that a ratio in a number density of atoms other than tungsten atoms and oxygen atoms to the tungsten atoms does not exceed approximately 0.83,
the hole injection layer has a recessed portion in an upper surface thereof at the region defined by the bank,
the recessed portion has (i) an inner bottom surface that is in contact with a bottom surface of the functional layer, and (ii) an inner side surface that is continuous with the inner bottom surface and in contact at least with part of a side surface of the functional layer, and
the inner side surface of the recessed portion has a lower edge and an upper edge, the lower edge being continuous with the inner bottom surface, and the upper edge being one of (i) aligned with part of a lower edge of the bank, the part being in contact with the light-emitting layer, and (ii) in contact with a bottom surface of the bank.

2. The organic EL element of claim 1, wherein
in the UPS spectrum, the protrusion appears within the region corresponding to the binding energy range from approximately 1.8 eV to approximately 3.6 eV lower than the top of the valence band.

3. The organic EL element of claim 1, wherein
the ratio in the number density of the other atoms to the tungsten atoms does not exceed approximately 0.62.

4. The organic EL element of claim 1, wherein
the atoms other than tungsten atoms and oxygen atoms comprise carbon atoms.

5. The organic EL element of claim 1, wherein
the hole injection layer is irradiated with ultraviolet light so that
the hole injection layer, in the UPS spectrum, obtained by the UPS measurement, has the protrusion appearing near the Fermi surface and within the region corresponding to the binding energy range lower than the top of the valence band, and
the tungsten oxide contained in the hole injection layer satisfies the condition, as determined by the XPS measurement, that the ratio in the number density of atoms other than tungsten atoms and oxygen atoms to the tungsten atoms does not exceed approximately 0.83.

6. The organic EL element of claim 1, wherein
the bank is liquid-repellent, and the hole injection layer is liquid-philic.

7. An organic EL element, comprising:
an anode;
a cathode;
a functional layer that is disposed between the anode and the cathode and includes at least a light-emitting layer made of an organic material;
a hole injection layer disposed between the anode and the functional layer; and
a bank that defines a region in which the light-emitting layer is to be formed, wherein
the hole injection layer contains tungsten oxide,
an Ultraviolet Photoelectron Spectroscopy (UPS) spectrum, obtained from a UPS measurement, has a protrusion appearing near a Fermi surface and within a region corresponding to a binding energy range lower than a top of a valence band,
a peak appears within a region corresponding to a binding energy range from approximately 4.5 eV to approximately 5.4 eV,
the hole injection layer has a recessed portion in an upper surface thereof at the region defined by the bank,
the recessed portion has (i) an inner bottom surface that is in contact with a bottom surface of the functional layer, and (ii) an inner side surface that is continuous with the inner bottom surface and in contact at least with part of a side surface of the functional layer, and
the inner side surface of the recessed portion has a lower edge and an upper edge, the lower edge being continuous with the inner bottom surface, and the upper edge being one of (i) aligned with part of a lower edge of the bank, the part being in contact with the light-emitting layer, and (ii) in contact with a bottom surface of the bank.

8. The organic EL element of claim 7, wherein
in the UPS spectrum, the protrusion appears within the region corresponding to the binding energy range from approximately 1.8 eV to approximately 3.6 eV lower than the top of the valence band.

9. The organic EL element of claim 7, wherein
the hole injection layer is irradiated with ultraviolet light so that
the hole injection layer, in the UPS spectrum, obtained by the UPS measurement, has the protrusion appearing near the Fermi surface and within the region corresponding to the binding energy range lower than the top of the valence band, and
the peak appears within the region corresponding to the binding energy range from approximately 4.5 eV to approximately 5.4 eV.

10. The organic EL element of claim 7, wherein
the bank is liquid-repellent, and the hole injection layer is liquid-philic.

11. A display apparatus comprising the organic EL element of claim 1.

12. A light-emitting apparatus comprising the organic EL element of claim 1.

13. The organic EL element of claim 1, wherein
the upper surface of the hole injection layer which has the recessed portion is located closer to the anode than entire bottom surfaces of the banks.

14. The organic EL element of claim 1, wherein
a film thickness of the hole injection layer in a region defined by the recessed portion is smaller than a film thickness in other regions, and the film thickness in the other regions is uniform.

15. The organic EL element of claim 1, wherein
a film thickness of the light-emitting layer is uniform.

16. The organic EL element of claim 1, wherein
the recessed portion extends under the bottom surface of at least one of the banks.

17. The organic EL element of claim 7, wherein
the upper surface of the hole injection layer which has the recessed portion is located closer to the anode than entire bottom surfaces of the banks.

18. The organic EL element of claim 7, wherein
a film thickness of the hole injection layer in a region defined by the recessed portion is smaller than a film thickness in other regions, and the film thickness in the other regions is uniform.

19. The organic EL element of claim 7, wherein
a film thickness of the light-emitting layer is uniform.

20. The organic EL element of claim 7, wherein
the recessed portion extends under the bottom surface of at least one of the banks.

* * * * *